US012111341B2

(12) United States Patent
Guo et al.

(10) Patent No.: US 12,111,341 B2
(45) Date of Patent: Oct. 8, 2024

(54) IN-SITU ELECTRIC FIELD DETECTION METHOD AND APPARATUS

(71) Applicant: Applied Materials, Inc., Santa Clara, CA (US)

(72) Inventors: Yue Guo, Redwood City, CA (US); Yang Yang, San Diego, CA (US); Kartik Ramaswamy, San Jose, CA (US); Fernando Silveira, Santa Clara, CA (US); A N M Wasekul Azad, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/960,666

(22) Filed: Oct. 5, 2022

(65) Prior Publication Data

US 2024/0118328 A1   Apr. 11, 2024

(51) Int. Cl.
G01R 29/08   (2006.01)

(52) U.S. Cl.
CPC .............................. G01R 29/0885 (2013.01)

(58) Field of Classification Search
CPC .................................................. G01R 29/0885
USPC ........................................................... 324/96
See application file for complete search history.

(56) References Cited

U.S. PATENT DOCUMENTS

| | | |
|---|---|---|
| 4,070,589 A | 1/1978 | Martinkovic |
| 4,340,462 A | 7/1982 | Koch |
| 4,464,223 A | 8/1984 | Gorin |
| 4,504,895 A | 3/1985 | Steigerwald |
| 4,585,516 A | 4/1986 | Corn et al. |

(Continued)

FOREIGN PATENT DOCUMENTS

| | | |
|---|---|---|
| JP | 2008244063 A | 10/2008 |
| JP | 2014082449 A | 5/2014 |
| KR | 10-2009-0010608 A | 1/2009 |

OTHER PUBLICATIONS

Rahmatian, Farnoosh, and Nicolas AF Jaeger. "High accuracy optical electric field and voltage sensors." 2002 15th Optical Fiber Sensors Conference Technical Digest. OFS 2002 (Cat. No. 02EX533). IEEE, 2002. (Year: 2002).*

(Continued)

*Primary Examiner* — Christopher P McAndrew
(74) *Attorney, Agent, or Firm* — Patterson + Sheridan, LLP

(57) ABSTRACT

Embodiments of the disclosure include an electric field measurement system that includes a first light source, a first light sensor configured to receive electromagnetic energy transmitted from the first light source, an electro-optic sensor, and a controller. The electro-optic sensor may include a package comprising a first electro-optic crystal disposed within a body; and at least one optical fiber. The optical fiber is configured to transmit electromagnetic energy transmitted from the first light source to a surface of the first electro-optic crystal, and transmit at least a portion of the electromagnetic energy transmitted to the surface of the first electro-optic crystal and subsequently passed through at least a portion of the first electro-optic crystal to the first light sensor that is configured to generate a signal based on an attribute of the electromagnetic energy received by the first light sensor from the at least one optical fiber. The controller is configured to generate a command signal based on a signal received from the first light sensor.

12 Claims, 7 Drawing Sheets

(56) References Cited

U.S. PATENT DOCUMENTS

| | | |
|---|---|---|
| 4,683,529 A | 7/1987 | Bucher, II |
| 4,931,135 A | 6/1990 | Horiuchi et al. |
| 4,992,919 A | 2/1991 | Lee et al. |
| 5,099,697 A | 3/1992 | Agar |
| 5,140,510 A | 8/1992 | Myers |
| 5,242,561 A | 9/1993 | Sato |
| 5,449,410 A | 9/1995 | Chang et al. |
| 5,451,846 A | 9/1995 | Peterson et al. |
| 5,464,499 A | 11/1995 | Moslehi et al. |
| 5,554,959 A | 9/1996 | Tang |
| 5,565,036 A | 10/1996 | Westendorp et al. |
| 5,595,627 A | 1/1997 | Inazawa et al. |
| 5,597,438 A | 1/1997 | Grewal et al. |
| 5,610,452 A | 3/1997 | Shimer et al. |
| 5,698,062 A | 12/1997 | Sakamoto et al. |
| 5,716,534 A | 2/1998 | Tsuchiya et al. |
| 5,770,023 A | 6/1998 | Sellers |
| 5,781,003 A * | 7/1998 | Kondo ............... G01R 15/241 324/96 |
| 5,796,598 A | 8/1998 | Nowak et al. |
| 5,810,982 A | 9/1998 | Sellers |
| 5,830,330 A | 11/1998 | Lantsman |
| 5,882,424 A | 3/1999 | Taylor et al. |
| 5,928,963 A | 7/1999 | Koshiishi |
| 5,933,314 A | 8/1999 | Lambson et al. |
| 5,935,373 A | 8/1999 | Koshimizu |
| 5,948,704 A | 9/1999 | Benjamin et al. |
| 5,997,687 A | 12/1999 | Koshimizu |
| 6,043,607 A | 3/2000 | Roderick |
| 6,051,114 A | 4/2000 | Yao et al. |
| 6,055,150 A | 4/2000 | Clinton et al. |
| 6,074,518 A | 6/2000 | Imafuku et al. |
| 6,089,181 A | 7/2000 | Suemasa et al. |
| 6,099,697 A | 8/2000 | Hausmann |
| 6,110,287 A | 8/2000 | Arai et al. |
| 6,117,279 A | 9/2000 | Smolanoff et al. |
| 6,125,025 A | 9/2000 | Howald et al. |
| 6,133,557 A | 10/2000 | Kawanabe et al. |
| 6,136,387 A | 10/2000 | Koizumi |
| 6,187,685 B1 | 2/2001 | Hopkins et al. |
| 6,197,151 B1 | 3/2001 | Kaji et al. |
| 6,198,616 B1 | 3/2001 | Dahimene et al. |
| 6,201,208 B1 | 3/2001 | Wendt et al. |
| 6,214,162 B1 | 4/2001 | Koshimizu |
| 6,232,236 B1 | 5/2001 | Shan et al. |
| 6,252,354 B1 | 6/2001 | Collins et al. |
| 6,253,704 B1 | 7/2001 | Savas |
| 6,277,506 B1 | 8/2001 | Okamoto |
| 6,309,978 B1 | 10/2001 | Donohoe et al. |
| 6,313,583 B1 | 11/2001 | Arita et al. |
| 6,355,992 B1 | 3/2002 | Via |
| 6,358,573 B1 | 3/2002 | Raoux et al. |
| 6,367,413 B1 | 4/2002 | Sill et al. |
| 6,392,187 B1 | 5/2002 | Johnson |
| 6,395,641 B2 | 5/2002 | Savas |
| 6,413,358 B2 | 7/2002 | Donohoe |
| 6,423,192 B1 | 7/2002 | Wada et al. |
| 6,433,297 B1 | 8/2002 | Kojima et al. |
| 6,435,131 B1 | 8/2002 | Koizumi |
| 6,451,389 B1 | 9/2002 | Amann et al. |
| 6,456,010 B2 | 9/2002 | Yamakoshi et al. |
| 6,483,731 B1 | 11/2002 | Isurin et al. |
| 6,535,785 B2 | 3/2003 | Johnson et al. |
| 6,621,674 B1 | 9/2003 | Zahringer et al. |
| 6,664,739 B1 | 12/2003 | Kishinevsky et al. |
| 6,733,624 B2 | 5/2004 | Koshiishi et al. |
| 6,740,842 B2 | 5/2004 | Johnson et al. |
| 6,741,446 B2 | 5/2004 | Ennis |
| 6,777,037 B2 | 8/2004 | Sumiya et al. |
| 6,808,607 B2 | 10/2004 | Christie |
| 6,818,103 B1 | 11/2004 | Scholl et al. |
| 6,818,257 B2 | 11/2004 | Amann et al. |
| 6,830,595 B2 | 12/2004 | Reynolds, III |
| 6,830,650 B2 | 12/2004 | Roche et al. |
| 6,849,154 B2 | 2/2005 | Nagahata et al. |
| 6,861,373 B2 | 3/2005 | Aoki et al. |
| 6,863,020 B2 | 3/2005 | Mitrovic et al. |
| 6,896,775 B2 | 5/2005 | Chistyakov |
| 6,902,646 B2 | 6/2005 | Mahoney et al. |
| 6,917,204 B2 | 7/2005 | Mitrovic et al. |
| 6,947,300 B2 | 9/2005 | Pai et al. |
| 6,962,664 B2 | 11/2005 | Mitrovic |
| 6,970,042 B2 | 11/2005 | Glueck |
| 6,972,524 B1 | 12/2005 | Marakhtanov et al. |
| 7,016,620 B2 | 3/2006 | Maess et al. |
| 7,046,088 B2 | 5/2006 | Ziegler |
| 7,059,267 B2 | 6/2006 | Hedberg et al. |
| 7,104,217 B2 | 9/2006 | Himori et al. |
| 7,115,185 B1 | 10/2006 | Gonzalez et al. |
| 7,126,808 B2 | 10/2006 | Koo et al. |
| 7,147,759 B2 | 12/2006 | Chistyakov |
| 7,151,242 B2 | 12/2006 | Schuler |
| 7,166,233 B2 | 1/2007 | Johnson et al. |
| 7,183,177 B2 | 2/2007 | Al-Bayati et al. |
| 7,206,189 B2 | 4/2007 | Reynolds, III |
| 7,218,503 B2 | 5/2007 | Howald |
| 7,218,872 B2 | 5/2007 | Shimomura |
| 7,226,868 B2 | 6/2007 | Mosden et al. |
| 7,265,963 B2 | 9/2007 | Hirose |
| 7,274,266 B2 | 9/2007 | Kirchmeier |
| 7,305,311 B2 | 12/2007 | van Zyl |
| 7,312,974 B2 | 12/2007 | Kuchimachi |
| 7,408,329 B2 | 8/2008 | Wiedemuth et al. |
| 7,415,940 B2 | 8/2008 | Koshimizu et al. |
| 7,440,301 B2 | 10/2008 | Kirchmeier et al. |
| 7,452,443 B2 | 11/2008 | Gluck et al. |
| 7,479,712 B2 | 1/2009 | Richert |
| 7,509,105 B2 | 3/2009 | Ziegler |
| 7,512,387 B2 | 3/2009 | Glueck |
| 7,535,688 B2 | 5/2009 | Yokouchi et al. |
| 7,586,099 B2 | 9/2009 | Eyhorn et al. |
| 7,586,210 B2 | 9/2009 | Wiedemuth et al. |
| 7,588,667 B2 | 9/2009 | Cerio, Jr. |
| 7,601,246 B2 | 10/2009 | Kim et al. |
| 7,609,740 B2 | 10/2009 | Glueck |
| 7,618,686 B2 | 11/2009 | Colpo et al. |
| 7,633,319 B2 | 12/2009 | Arai |
| 7,645,341 B2 | 1/2010 | Kennedy et al. |
| 7,651,586 B2 | 1/2010 | Moriya et al. |
| 7,652,901 B2 | 1/2010 | Kirchmeier et al. |
| 7,692,936 B2 | 4/2010 | Richter |
| 7,700,474 B2 | 4/2010 | Cerio, Jr. |
| 7,705,676 B2 | 4/2010 | Kirchmeier et al. |
| 7,706,907 B2 | 4/2010 | Hiroki |
| 7,718,538 B2 | 5/2010 | Kim et al. |
| 7,740,704 B2 | 6/2010 | Strang |
| 7,758,764 B2 | 7/2010 | Dhindsa et al. |
| 7,761,247 B2 | 7/2010 | van Zyl |
| 7,782,100 B2 | 8/2010 | Steuber et al. |
| 7,791,912 B2 | 9/2010 | Walde |
| 7,795,817 B2 | 9/2010 | Nitschke |
| 7,808,184 B2 | 10/2010 | Chistyakov |
| 7,821,767 B2 | 10/2010 | Fujii |
| 7,825,719 B2 | 11/2010 | Roberg et al. |
| 7,858,533 B2 | 12/2010 | Liu et al. |
| 7,888,240 B2 | 2/2011 | Hamamjy et al. |
| 7,898,238 B2 | 3/2011 | Wiedemuth et al. |
| 7,929,261 B2 | 4/2011 | Wiedemuth |
| RE42,362 E | 5/2011 | Schuler |
| 7,977,256 B2 | 7/2011 | Liu et al. |
| 7,988,816 B2 | 8/2011 | Koshiishi et al. |
| 7,995,313 B2 | 8/2011 | Nitschke |
| 8,044,595 B2 | 10/2011 | Nitschke |
| 8,052,798 B2 | 11/2011 | Moriya et al. |
| 8,055,203 B2 | 11/2011 | Choueiry et al. |
| 8,083,961 B2 | 12/2011 | Chen et al. |
| 8,110,992 B2 | 2/2012 | Nitschke |
| 8,128,831 B2 | 3/2012 | Sato et al. |
| 8,129,653 B2 | 3/2012 | Kirchmeier et al. |
| 8,133,347 B2 | 3/2012 | Gluck et al. |
| 8,133,359 B2 | 3/2012 | Nauman et al. |
| 8,140,292 B2 | 3/2012 | Wendt |
| 8,217,299 B2 | 7/2012 | Ilic et al. |
| 8,221,582 B2 | 7/2012 | Patrick et al. |

(56) References Cited

U.S. PATENT DOCUMENTS

| | | |
|---|---|---|
| 8,236,109 B2 | 8/2012 | Moriya et al. |
| 8,284,580 B2 | 10/2012 | Wilson |
| 8,313,612 B2 | 11/2012 | McMillin et al. |
| 8,313,664 B2 | 11/2012 | Chen et al. |
| 8,333,114 B2 | 12/2012 | Hayashi |
| 8,361,906 B2 | 1/2013 | Lee et al. |
| 8,382,999 B2 | 2/2013 | Agarwal et al. |
| 8,383,001 B2 | 2/2013 | Mochiki et al. |
| 8,384,403 B2 | 2/2013 | Zollner et al. |
| 8,391,025 B2 | 3/2013 | Walde et al. |
| 8,399,366 B1 | 3/2013 | Takaba |
| 8,419,959 B2 | 4/2013 | Bettencourt et al. |
| 8,422,193 B2 | 4/2013 | Tao et al. |
| 8,441,772 B2 | 5/2013 | Yoshikawa et al. |
| 8,456,220 B2 | 6/2013 | Thome et al. |
| 8,460,567 B2 | 6/2013 | Chen |
| 8,466,622 B2 | 6/2013 | Knaus |
| 8,542,076 B2 | 9/2013 | Maier |
| 8,551,289 B2 | 10/2013 | Nishimura et al. |
| 8,568,606 B2 | 10/2013 | Ohse et al. |
| 8,603,293 B2 | 12/2013 | Koshiishi et al. |
| 8,632,537 B2 | 1/2014 | McNall, III et al. |
| 8,641,916 B2 | 2/2014 | Yatsuda et al. |
| 8,685,267 B2 | 4/2014 | Yatsuda et al. |
| 8,704,607 B2 | 4/2014 | Yuzurihara et al. |
| 8,716,114 B2 | 5/2014 | Ohmi et al. |
| 8,716,984 B2 | 5/2014 | Mueller et al. |
| 8,735,291 B2 | 5/2014 | Ranjan et al. |
| 8,796,933 B2 | 8/2014 | Hermanns |
| 8,809,199 B2 | 8/2014 | Nishizuka |
| 8,821,684 B2 | 9/2014 | Ui et al. |
| 8,828,883 B2 | 9/2014 | Rueger |
| 8,845,810 B2 | 9/2014 | Hwang |
| 8,852,347 B2 | 10/2014 | Lee et al. |
| 8,884,523 B2 | 11/2014 | Winterhalter et al. |
| 8,884,525 B2 | 11/2014 | Hoffman et al. |
| 8,889,534 B1 | 11/2014 | Ventzek et al. |
| 8,895,942 B2 | 11/2014 | Liu et al. |
| 8,907,259 B2 | 12/2014 | Kasai et al. |
| 8,916,056 B2 | 12/2014 | Koo et al. |
| 8,926,850 B2 | 1/2015 | Singh et al. |
| 8,963,377 B2 | 2/2015 | Ziemba et al. |
| 8,979,842 B2 | 3/2015 | McNall, III et al. |
| 8,993,943 B2 | 3/2015 | Pohl et al. |
| 9,011,636 B2 | 4/2015 | Ashida |
| 9,039,871 B2 | 5/2015 | Nauman et al. |
| 9,042,121 B2 | 5/2015 | Walde et al. |
| 9,053,908 B2 | 6/2015 | Sriraman et al. |
| 9,059,178 B2 | 6/2015 | Matsumoto et al. |
| 9,087,798 B2 | 7/2015 | Ohtake et al. |
| 9,101,038 B2 | 8/2015 | Singh et al. |
| 9,105,447 B2 | 8/2015 | Brouk et al. |
| 9,105,452 B2 | 8/2015 | Jeon et al. |
| 9,123,762 B2 | 9/2015 | Lin et al. |
| 9,129,776 B2 | 9/2015 | Finley et al. |
| 9,139,910 B2 | 9/2015 | Lee et al. |
| 9,147,555 B2 | 9/2015 | Richter |
| 9,150,960 B2 | 10/2015 | Nauman et al. |
| 9,159,575 B2 | 10/2015 | Ranjan et al. |
| 9,208,992 B2 | 12/2015 | Brouk et al. |
| 9,209,032 B2 | 12/2015 | Zhao et al. |
| 9,209,034 B2 | 12/2015 | Kitamura et al. |
| 9,210,790 B2 | 12/2015 | Hoffman et al. |
| 9,224,579 B2 | 12/2015 | Finley et al. |
| 9,226,380 B2 | 12/2015 | Finley |
| 9,228,878 B2 | 1/2016 | Haw et al. |
| 9,254,168 B2 | 2/2016 | Palanker |
| 9,263,241 B2 | 2/2016 | Larson et al. |
| 9,287,086 B2 | 3/2016 | Brouk et al. |
| 9,287,092 B2 | 3/2016 | Brouk et al. |
| 9,287,098 B2 | 3/2016 | Finley |
| 9,306,533 B1 | 4/2016 | Mavretic |
| 9,309,594 B2 | 4/2016 | Hoffman et al. |
| 9,313,872 B2 | 4/2016 | Yamazawa et al. |
| 9,355,822 B2 | 5/2016 | Yamada et al. |
| 9,362,089 B2 | 6/2016 | Brouk et al. |
| 9,373,521 B2 | 6/2016 | Mochiki et al. |
| 9,384,992 B2 | 7/2016 | Narishige et al. |
| 9,396,960 B2 | 7/2016 | Ogawa et al. |
| 9,404,176 B2 | 8/2016 | Parkhe et al. |
| 9,412,613 B2 | 8/2016 | Manna et al. |
| 9,435,029 B2 | 9/2016 | Brouk et al. |
| 9,483,066 B2 | 11/2016 | Finley |
| 9,490,107 B2 | 11/2016 | Kim et al. |
| 9,495,563 B2 | 11/2016 | Ziemba et al. |
| 9,496,150 B2 | 11/2016 | Mochiki et al. |
| 9,503,006 B2 | 11/2016 | Pohl et al. |
| 9,520,269 B2 | 12/2016 | Finley et al. |
| 9,530,667 B2 | 12/2016 | Rastogi et al. |
| 9,536,713 B2 | 1/2017 | Van Zyl et al. |
| 9,544,987 B2 | 1/2017 | Mueller et al. |
| 9,558,917 B2 | 1/2017 | Finley et al. |
| 9,564,287 B2 | 2/2017 | Ohse et al. |
| 9,570,313 B2 | 2/2017 | Ranjan et al. |
| 9,576,810 B2 | 2/2017 | Deshmukh et al. |
| 9,576,816 B2 | 2/2017 | Rastogi et al. |
| 9,577,516 B1 | 2/2017 | Van Zyl |
| 9,583,357 B1 | 2/2017 | Long et al. |
| 9,593,421 B2 | 3/2017 | Baek et al. |
| 9,601,283 B2 | 3/2017 | Ziemba et al. |
| 9,601,319 B1 | 3/2017 | Bravo et al. |
| 9,607,843 B2 | 3/2017 | Rastogi et al. |
| 9,620,340 B2 | 4/2017 | Finley |
| 9,620,376 B2 | 4/2017 | Kamp et al. |
| 9,620,987 B2 | 4/2017 | Alexander et al. |
| 9,637,814 B2 | 5/2017 | Bugyi et al. |
| 9,644,221 B2 | 5/2017 | Kanamori et al. |
| 9,651,957 B1 | 5/2017 | Finley |
| 9,655,221 B2 | 5/2017 | Ziemba et al. |
| 9,663,858 B2 | 5/2017 | Nagami et al. |
| 9,666,446 B2 | 5/2017 | Tominaga et al. |
| 9,666,447 B2 | 5/2017 | Rastogi et al. |
| 9,673,027 B2 | 6/2017 | Yamamoto et al. |
| 9,673,059 B2 | 6/2017 | Raley et al. |
| 9,685,297 B2 | 6/2017 | Carter et al. |
| 9,706,630 B2 | 7/2017 | Miller et al. |
| 9,711,331 B2 | 7/2017 | Mueller et al. |
| 9,711,335 B2 | 7/2017 | Christie |
| 9,728,429 B2 | 8/2017 | Ricci et al. |
| 9,734,992 B2 | 8/2017 | Yamada et al. |
| 9,741,544 B2 | 8/2017 | Van Zyl |
| 9,754,768 B2 | 9/2017 | Yamada et al. |
| 9,761,419 B2 | 9/2017 | Nagami |
| 9,761,459 B2 | 9/2017 | Long et al. |
| 9,767,988 B2 | 9/2017 | Brouk et al. |
| 9,786,503 B2 | 10/2017 | Raley et al. |
| 9,799,494 B2 | 10/2017 | Chen et al. |
| 9,805,916 B2 | 10/2017 | Konno et al. |
| 9,805,965 B2 | 10/2017 | Sadjadi et al. |
| 9,812,305 B2 | 11/2017 | Pelleymounter |
| 9,831,064 B2 | 11/2017 | Konno et al. |
| 9,837,285 B2 | 12/2017 | Tomura et al. |
| 9,840,770 B2 | 12/2017 | Klimczak et al. |
| 9,852,889 B1 | 12/2017 | Kellogg et al. |
| 9,852,890 B2 | 12/2017 | Mueller et al. |
| 9,865,471 B2 | 1/2018 | Shimoda et al. |
| 9,865,893 B2 | 1/2018 | Esswein et al. |
| 9,870,898 B2 | 1/2018 | Urakawa et al. |
| 9,872,373 B1 | 1/2018 | Shimizu et al. |
| 9,881,820 B2 | 1/2018 | Wong et al. |
| 9,922,802 B2 | 3/2018 | Hirano et al. |
| 9,922,806 B2 | 3/2018 | Tomura et al. |
| 9,929,004 B2 | 3/2018 | Ziemba et al. |
| 9,941,097 B2 | 4/2018 | Yamazawa et al. |
| 9,941,098 B2 | 4/2018 | Nagami |
| 9,960,763 B2 | 5/2018 | Miller et al. |
| 9,972,503 B2 | 5/2018 | Tomura et al. |
| 9,997,374 B2 | 6/2018 | Takeda et al. |
| 10,020,800 B2 | 7/2018 | Prager et al. |
| 10,026,593 B2 | 7/2018 | Alt et al. |
| 10,027,314 B2 | 7/2018 | Prager et al. |
| 10,041,174 B2 | 8/2018 | Matsumoto et al. |
| 10,042,407 B2 | 8/2018 | Grede et al. |
| 10,063,062 B2 | 8/2018 | Voronin et al. |

(56) References Cited

U.S. PATENT DOCUMENTS

| | | |
|---|---|---|
| 10,074,518 B2 | 9/2018 | Van Zyl |
| 10,085,796 B2 | 10/2018 | Podany |
| 10,090,191 B2 | 10/2018 | Tomura et al. |
| 10,102,321 B2 | 10/2018 | Povolny et al. |
| 10,109,461 B2 | 10/2018 | Yamada et al. |
| 10,115,567 B2 | 10/2018 | Hirano et al. |
| 10,115,568 B2 | 10/2018 | Kellogg et al. |
| 10,134,569 B1 | 11/2018 | Albarede et al. |
| 10,176,970 B2 | 1/2019 | Nitschke |
| 10,176,971 B2 | 1/2019 | Nagami |
| 10,181,392 B2 | 1/2019 | Leypold et al. |
| 10,199,246 B2 | 2/2019 | Koizumi et al. |
| 10,217,618 B2 | 2/2019 | Larson et al. |
| 10,217,933 B2 | 2/2019 | Nishimura et al. |
| 10,224,822 B2 | 3/2019 | Miller et al. |
| 10,229,819 B2 | 3/2019 | Hirano et al. |
| 10,249,498 B2 | 4/2019 | Ventzek et al. |
| 10,268,846 B2 | 4/2019 | Miller et al. |
| 10,269,540 B1 | 4/2019 | Carter et al. |
| 10,276,420 B2 | 4/2019 | Ito et al. |
| 10,282,567 B2 | 5/2019 | Miller et al. |
| 10,283,321 B2 | 5/2019 | Yang et al. |
| 10,290,506 B2 | 5/2019 | Ranjan et al. |
| 10,297,431 B2 | 5/2019 | Zelechowski et al. |
| 10,304,661 B2 | 5/2019 | Ziemba et al. |
| 10,304,668 B2 | 5/2019 | Coppa et al. |
| 10,312,048 B2 | 6/2019 | Dorf et al. |
| 10,312,056 B2 | 6/2019 | Collins et al. |
| 10,320,373 B2 | 6/2019 | Prager et al. |
| 10,332,730 B2 | 6/2019 | Christie |
| 10,340,123 B2 | 7/2019 | Ohtake |
| 10,348,186 B2 | 7/2019 | Schuler et al. |
| 10,354,839 B2 | 7/2019 | Alt et al. |
| 10,373,755 B2 | 8/2019 | Prager et al. |
| 10,373,804 B2 | 8/2019 | Koh et al. |
| 10,373,811 B2 | 8/2019 | Christie et al. |
| 10,381,237 B2 | 8/2019 | Takeda et al. |
| 10,382,022 B2 | 8/2019 | Prager et al. |
| 10,387,166 B2 | 8/2019 | Preston et al. |
| 10,388,544 B2 | 8/2019 | Ui et al. |
| 10,389,345 B2 | 8/2019 | Ziemba et al. |
| 10,410,877 B2 | 9/2019 | Takashima et al. |
| 10,431,437 B2 | 10/2019 | Gapi70nski et al. |
| 10,438,797 B2 | 10/2019 | Cottle et al. |
| 10,446,453 B2 | 10/2019 | Coppa et al. |
| 10,447,174 B1 | 10/2019 | Porter, Jr. et al. |
| 10,448,494 B1 | 10/2019 | Dorf et al. |
| 10,448,495 B1 | 10/2019 | Dorf et al. |
| 10,453,656 B2 | 10/2019 | Carducci et al. |
| 10,460,910 B2 | 10/2019 | Ziemba et al. |
| 10,460,911 B2 | 10/2019 | Ziemba et al. |
| 10,460,916 B2 | 10/2019 | Boyd, Jr. et al. |
| 10,483,089 B2 | 11/2019 | Ziemba et al. |
| 10,483,100 B2 | 11/2019 | Ishizaka et al. |
| 10,510,575 B2 | 12/2019 | Kraus et al. |
| 10,522,343 B2 | 12/2019 | Tapily et al. |
| 10,535,502 B2 | 1/2020 | Carducci et al. |
| 10,546,728 B2 | 1/2020 | Carducci et al. |
| 10,553,407 B2 | 2/2020 | Nagami et al. |
| 10,555,412 B2 | 2/2020 | Dorf et al. |
| 10,580,620 B2 | 3/2020 | Carducci et al. |
| 10,593,519 B2 | 3/2020 | Yamada et al. |
| 10,607,813 B2 | 3/2020 | Fairbairn et al. |
| 10,607,814 B2 | 3/2020 | Ziemba et al. |
| 10,658,189 B2 | 5/2020 | Hatazaki et al. |
| 10,659,019 B2 | 5/2020 | Slobodov et al. |
| 10,665,434 B2 | 5/2020 | Matsumoto et al. |
| 10,666,198 B2 | 5/2020 | Prager et al. |
| 10,672,589 B2 | 6/2020 | Koshimizu et al. |
| 10,672,596 B2 | 6/2020 | Brcka |
| 10,672,616 B2 | 6/2020 | Kubota |
| 10,685,807 B2 | 6/2020 | Dorf et al. |
| 10,707,053 B2 | 7/2020 | Urakawa et al. |
| 10,707,054 B1 | 7/2020 | Kubota |
| 10,707,055 B2 | 7/2020 | Shaw et al. |
| 10,707,086 B2 | 7/2020 | Yang et al. |
| 10,707,090 B2 | 7/2020 | Takayama et al. |
| 10,707,864 B2 | 7/2020 | Miller et al. |
| 10,714,372 B2 | 7/2020 | Chua et al. |
| 10,720,305 B2 | 7/2020 | Van Zyl |
| 10,734,906 B2 | 8/2020 | Miller et al. |
| 10,748,746 B2 | 8/2020 | Kaneko et al. |
| 10,755,894 B2 | 8/2020 | Hirano et al. |
| 10,763,150 B2 | 9/2020 | Lindley et al. |
| 10,773,282 B2 | 9/2020 | Coppa et al. |
| 10,774,423 B2 | 9/2020 | Janakiraman et al. |
| 10,777,388 B2 | 9/2020 | Ziemba et al. |
| 10,790,816 B2 | 9/2020 | Ziemba et al. |
| 10,791,617 B2 | 9/2020 | Dorf et al. |
| 10,796,887 B2 | 10/2020 | Prager et al. |
| 10,804,886 B2 | 10/2020 | Miller et al. |
| 10,811,227 B2 | 10/2020 | Van Zyl et al. |
| 10,811,228 B2 | 10/2020 | Van Zyl et al. |
| 10,811,229 B2 | 10/2020 | Van Zyl et al. |
| 10,811,230 B2 | 10/2020 | Ziemba et al. |
| 10,811,296 B2 | 10/2020 | Cho et al. |
| 10,847,346 B2 | 11/2020 | Ziemba et al. |
| 10,892,140 B2 | 1/2021 | Ziemba et al. |
| 10,892,141 B2 | 1/2021 | Ziemba et al. |
| 10,896,807 B2 | 1/2021 | Fairbairn et al. |
| 10,896,809 B2 | 1/2021 | Ziemba et al. |
| 10,903,047 B2 | 1/2021 | Ziemba et al. |
| 10,904,996 B2 | 1/2021 | Koh et al. |
| 10,916,408 B2 | 2/2021 | Dorf et al. |
| 10,923,320 B2 | 2/2021 | Koh et al. |
| 10,923,321 B2 | 2/2021 | Dorf et al. |
| 10,923,367 B2 | 2/2021 | Lubomirsky et al. |
| 10,923,379 B2 | 2/2021 | Liu et al. |
| 10,971,342 B2 | 4/2021 | Engelstaedter et al. |
| 10,978,274 B2 | 4/2021 | Kubota |
| 10,978,955 B2 | 4/2021 | Ziemba et al. |
| 10,985,740 B2 | 4/2021 | Prager et al. |
| 10,991,553 B2 | 4/2021 | Ziemba et al. |
| 10,991,554 B2 | 4/2021 | Zhao et al. |
| 10,998,169 B2 | 5/2021 | Ventzek et al. |
| 11,004,660 B2 | 5/2021 | Prager et al. |
| 11,011,349 B2 | 5/2021 | Brouk et al. |
| 11,075,058 B2 | 7/2021 | Ziemba et al. |
| 11,095,280 B2 | 8/2021 | Ziemba et al. |
| 11,101,108 B2 | 8/2021 | Slobodov et al. |
| 11,108,384 B2 | 8/2021 | Prager et al. |
| 11,476,090 B1 | 10/2022 | Ramaswamy et al. |
| 2001/0003298 A1 | 6/2001 | Shamouilian et al. |
| 2001/0009139 A1 | 7/2001 | Shan et al. |
| 2001/0033755 A1 | 10/2001 | Ino et al. |
| 2002/0069971 A1 | 6/2002 | Kaji et al. |
| 2002/0078891 A1 | 6/2002 | Chu et al. |
| 2003/0026060 A1 | 2/2003 | Hiramatsu et al. |
| 2003/0029859 A1 | 2/2003 | Knoot et al. |
| 2003/0049558 A1 | 3/2003 | Aoki et al. |
| 2003/0052085 A1 | 3/2003 | Parsons |
| 2003/0079983 A1 | 5/2003 | Long et al. |
| 2003/0091355 A1 | 5/2003 | Jeschonek et al. |
| 2003/0137791 A1 | 7/2003 | Arnet et al. |
| 2003/0151372 A1 | 8/2003 | Tsuchiya et al. |
| 2003/0165044 A1 | 9/2003 | Yamamoto |
| 2003/0201069 A1 | 10/2003 | Johnson |
| 2004/0021094 A1 | 2/2004 | Johnson et al. |
| 2004/0040665 A1 | 3/2004 | Mizuno et al. |
| 2004/0040931 A1 | 3/2004 | Koshiishi et al. |
| 2004/0066601 A1 | 4/2004 | Larsen |
| 2004/0112536 A1 | 6/2004 | Quon |
| 2004/0223284 A1 | 11/2004 | Iwami et al. |
| 2005/0022933 A1 | 2/2005 | Howard |
| 2005/0024809 A1 | 2/2005 | Kuchimachi |
| 2005/0039852 A1 | 2/2005 | Roche et al. |
| 2005/0092596 A1 | 5/2005 | Kouznetsov |
| 2005/0098118 A1 | 5/2005 | Amann et al. |
| 2005/0151544 A1 | 7/2005 | Mahoney et al. |
| 2005/0152159 A1 | 7/2005 | Isurin et al. |
| 2005/0286916 A1 | 12/2005 | Nakazato et al. |
| 2006/0075969 A1 | 4/2006 | Fischer |
| 2006/0130767 A1 | 6/2006 | Herchen |

(56) References Cited

U.S. PATENT DOCUMENTS

| | | |
|---|---|---|
| 2006/0139843 A1 | 6/2006 | Kim |
| 2006/0158823 A1 | 7/2006 | Mizuno et al. |
| 2006/0171848 A1 | 8/2006 | Roche et al. |
| 2006/0219178 A1 | 10/2006 | Asakura |
| 2006/0278521 A1 | 12/2006 | Stowell |
| 2007/0113787 A1 | 5/2007 | Higashiura et al. |
| 2007/0114981 A1 | 5/2007 | Vasquez et al. |
| 2007/0196977 A1 | 8/2007 | Wang et al. |
| 2007/0284344 A1 | 12/2007 | Todorov et al. |
| 2007/0285869 A1 | 12/2007 | Howald |
| 2007/0297118 A1 | 12/2007 | Fujii |
| 2008/0012548 A1 | 1/2008 | Gerhardt et al. |
| 2008/0037196 A1 | 2/2008 | Yonekura et al. |
| 2008/0048498 A1 | 2/2008 | Wiedemuth et al. |
| 2008/0106842 A1 | 5/2008 | Ito et al. |
| 2008/0135401 A1 | 6/2008 | Kadlec et al. |
| 2008/0160212 A1 | 7/2008 | Koo et al. |
| 2008/0185537 A1 | 8/2008 | Walther et al. |
| 2008/0210545 A1 | 9/2008 | Kouznetsov |
| 2008/0236493 A1 | 10/2008 | Sakao |
| 2008/0252225 A1 | 10/2008 | Kurachi et al. |
| 2008/0272706 A1 | 11/2008 | Kwon et al. |
| 2008/0289576 A1 | 11/2008 | Lee et al. |
| 2009/0016549 A1 | 1/2009 | French et al. |
| 2009/0059462 A1 | 3/2009 | Mizuno et al. |
| 2009/0066952 A1* | 3/2009 | Wu ................ G01R 29/0885 356/365 |
| 2009/0078678 A1 | 3/2009 | Kojima et al. |
| 2009/0133839 A1 | 5/2009 | Yamazawa et al. |
| 2009/0236214 A1 | 9/2009 | Janakiraman et al. |
| 2009/0295295 A1 | 12/2009 | Shannon et al. |
| 2010/0018648 A1 | 1/2010 | Collins et al. |
| 2010/0025230 A1 | 2/2010 | Ehiasarian et al. |
| 2010/0029038 A1 | 2/2010 | Murakawa |
| 2010/0072172 A1 | 3/2010 | Ui et al. |
| 2010/0101935 A1 | 4/2010 | Chistyakov et al. |
| 2010/0118464 A1 | 5/2010 | Matsuyama |
| 2010/0154994 A1 | 6/2010 | Fischer et al. |
| 2010/0193491 A1 | 8/2010 | Cho et al. |
| 2010/0271744 A1 | 10/2010 | Ni et al. |
| 2010/0276273 A1 | 11/2010 | Heckman et al. |
| 2010/0321047 A1 | 12/2010 | Zollner et al. |
| 2010/0326957 A1 | 12/2010 | Maeda et al. |
| 2011/0001971 A1* | 1/2011 | Iwanami ........... G01R 29/0885 324/97 |
| 2011/0096461 A1 | 4/2011 | Yoshikawa et al. |
| 2011/0100807 A1 | 5/2011 | Matsubara et al. |
| 2011/0143537 A1 | 6/2011 | Lee et al. |
| 2011/0157760 A1 | 6/2011 | Willwerth et al. |
| 2011/0177669 A1 | 7/2011 | Lee et al. |
| 2011/0177694 A1 | 7/2011 | Chen et al. |
| 2011/0259851 A1 | 10/2011 | Brouk et al. |
| 2011/0281438 A1 | 11/2011 | Lee et al. |
| 2011/0298376 A1 | 12/2011 | Kanegae et al. |
| 2012/0000421 A1 | 1/2012 | Miller et al. |
| 2012/0052599 A1 | 3/2012 | Brouk et al. |
| 2012/0081350 A1 | 4/2012 | Sano et al. |
| 2012/0088371 A1 | 4/2012 | Ranjan et al. |
| 2012/0097908 A1 | 4/2012 | Willwerth et al. |
| 2012/0171390 A1 | 7/2012 | Nauman et al. |
| 2012/0319584 A1 | 12/2012 | Brouk et al. |
| 2013/0026381 A1 | 1/2013 | Huang et al. |
| 2013/0045008 A1* | 2/2013 | Miyazaki ........... G01R 29/0885 398/38 |
| 2013/0059448 A1 | 3/2013 | Marakhtanov et al. |
| 2013/0087447 A1 | 4/2013 | Bodke et al. |
| 2013/0175575 A1 | 7/2013 | Ziemba et al. |
| 2013/0213935 A1 | 8/2013 | Liao et al. |
| 2013/0214828 A1 | 8/2013 | Valcore, Jr. et al. |
| 2013/0340938 A1 | 12/2013 | Tappan et al. |
| 2013/0344702 A1 | 12/2013 | Nishizuka |
| 2014/0015541 A1* | 1/2014 | Sakai ................ G01R 29/0871 324/537 |
| 2014/0057447 A1 | 2/2014 | Yang et al. |
| 2014/0061156 A1 | 3/2014 | Brouk et al. |
| 2014/0062495 A1 | 3/2014 | Carter et al. |
| 2014/0077611 A1 | 3/2014 | Young et al. |
| 2014/0109886 A1 | 4/2014 | Singleton et al. |
| 2014/0117861 A1 | 5/2014 | Finley et al. |
| 2014/0125315 A1 | 5/2014 | Kirchmeier et al. |
| 2014/0154819 A1 | 6/2014 | Gaff et al. |
| 2014/0177123 A1 | 6/2014 | Thach et al. |
| 2014/0238844 A1 | 8/2014 | Chistyakov |
| 2014/0262755 A1 | 9/2014 | Deshmukh et al. |
| 2014/0263182 A1 | 9/2014 | Chen et al. |
| 2014/0273487 A1 | 9/2014 | Deshmukh et al. |
| 2014/0305905 A1 | 10/2014 | Yamada et al. |
| 2014/0356984 A1 | 12/2014 | Ventzek et al. |
| 2014/0361690 A1 | 12/2014 | Yamada et al. |
| 2015/0002018 A1 | 1/2015 | Lill et al. |
| 2015/0043123 A1 | 2/2015 | Cox |
| 2015/0076112 A1 | 3/2015 | Sriraman et al. |
| 2015/0084509 A1 | 3/2015 | Yuzurihara et al. |
| 2015/0111394 A1 | 4/2015 | Hsu et al. |
| 2015/0116889 A1 | 4/2015 | Yamasaki et al. |
| 2015/0130354 A1 | 5/2015 | Leray et al. |
| 2015/0130525 A1 | 5/2015 | Miller et al. |
| 2015/0170952 A1 | 6/2015 | Subramani et al. |
| 2015/0181683 A1 | 6/2015 | Singh et al. |
| 2015/0235809 A1 | 8/2015 | Ito et al. |
| 2015/0256086 A1 | 9/2015 | Miller et al. |
| 2015/0303914 A1 | 10/2015 | Ziemba et al. |
| 2015/0315698 A1 | 11/2015 | Chistyakov |
| 2015/0318846 A1 | 11/2015 | Prager et al. |
| 2015/0325413 A1 | 11/2015 | Kim et al. |
| 2015/0366004 A1 | 12/2015 | Nangoy et al. |
| 2016/0004475 A1 | 1/2016 | Beniyama et al. |
| 2016/0020072 A1 | 1/2016 | Brouk et al. |
| 2016/0027678 A1 | 1/2016 | Parkhe et al. |
| 2016/0056017 A1 | 2/2016 | Kim et al. |
| 2016/0064189 A1 | 3/2016 | Tandou et al. |
| 2016/0196958 A1 | 7/2016 | Leray et al. |
| 2016/0241234 A1 | 8/2016 | Mavretic |
| 2016/0284514 A1 | 9/2016 | Hirano et al. |
| 2016/0314946 A1 | 10/2016 | Pelleymounter |
| 2016/0322242 A1 | 11/2016 | Nguyen et al. |
| 2016/0327029 A1 | 11/2016 | Ziemba et al. |
| 2016/0351375 A1 | 12/2016 | Valcore, Jr. et al. |
| 2016/0358755 A1 | 12/2016 | Long et al. |
| 2017/0011887 A1 | 1/2017 | Deshmukh et al. |
| 2017/0018411 A1 | 1/2017 | Sriraman et al. |
| 2017/0022604 A1 | 1/2017 | Christie et al. |
| 2017/0029937 A1 | 2/2017 | Chistyakov et al. |
| 2017/0069462 A1 | 3/2017 | Kanarik et al. |
| 2017/0076962 A1 | 3/2017 | Engelhardt |
| 2017/0098527 A1 | 4/2017 | Kawasaki et al. |
| 2017/0098549 A1 | 4/2017 | Agarwal |
| 2017/0110335 A1 | 4/2017 | Yang et al. |
| 2017/0110358 A1 | 4/2017 | Sadjadi et al. |
| 2017/0113355 A1 | 4/2017 | Genetti et al. |
| 2017/0115657 A1 | 4/2017 | Trussell et al. |
| 2017/0117172 A1 | 4/2017 | Genetti et al. |
| 2017/0154726 A1 | 6/2017 | Prager et al. |
| 2017/0162417 A1 | 6/2017 | Ye et al. |
| 2017/0163254 A1 | 6/2017 | Ziemba et al. |
| 2017/0169996 A1 | 6/2017 | Ui et al. |
| 2017/0170449 A1 | 6/2017 | Alexander et al. |
| 2017/0178917 A1 | 6/2017 | Kamp et al. |
| 2017/0221682 A1 | 8/2017 | Nishimura et al. |
| 2017/0236688 A1 | 8/2017 | Caron et al. |
| 2017/0236741 A1 | 8/2017 | Angelov et al. |
| 2017/0236743 A1 | 8/2017 | Severson et al. |
| 2017/0243731 A1 | 8/2017 | Ziemba et al. |
| 2017/0250056 A1 | 8/2017 | Boswell et al. |
| 2017/0263478 A1 | 9/2017 | McChesney et al. |
| 2017/0278665 A1 | 9/2017 | Carter et al. |
| 2017/0287791 A1 | 10/2017 | Coppa et al. |
| 2017/0311431 A1 | 10/2017 | Park |
| 2017/0316935 A1 | 11/2017 | Tan et al. |
| 2017/0330734 A1 | 11/2017 | Lee et al. |
| 2017/0330786 A1 | 11/2017 | Genetti et al. |
| 2017/0334074 A1 | 11/2017 | Genetti et al. |
| 2017/0358431 A1 | 12/2017 | Dorf et al. |
| 2017/0366173 A1 | 12/2017 | Miller et al. |

(56) References Cited

U.S. PATENT DOCUMENTS

| | | |
|---|---|---|
| 2017/0372912 A1 | 12/2017 | Long et al. |
| 2018/0019100 A1 | 1/2018 | Brouk et al. |
| 2018/0076032 A1 | 3/2018 | Wang et al. |
| 2018/0102769 A1 | 4/2018 | Prager et al. |
| 2018/0139834 A1 | 5/2018 | Nagashima et al. |
| 2018/0166249 A1 | 6/2018 | Dorf et al. |
| 2018/0189524 A1 | 7/2018 | Miller et al. |
| 2018/0190501 A1 | 7/2018 | Ueda |
| 2018/0204708 A1 | 7/2018 | Tan et al. |
| 2018/0205369 A1 | 7/2018 | Prager et al. |
| 2018/0218905 A1 | 8/2018 | Park et al. |
| 2018/0226225 A1 | 8/2018 | Koh et al. |
| 2018/0226896 A1 | 8/2018 | Miller et al. |
| 2018/0253570 A1 | 9/2018 | Miller et al. |
| 2018/0286636 A1 | 10/2018 | Ziemba et al. |
| 2018/0294566 A1 | 10/2018 | Wang et al. |
| 2018/0309423 A1 | 10/2018 | Okunishi et al. |
| 2018/0331655 A1 | 11/2018 | Prager et al. |
| 2018/0350649 A1 | 12/2018 | Gomm |
| 2018/0366305 A1 | 12/2018 | Nagami et al. |
| 2018/0374672 A1 | 12/2018 | Hayashi et al. |
| 2019/0027344 A1 | 1/2019 | Okunishi et al. |
| 2019/0080884 A1 | 3/2019 | Ziemba et al. |
| 2019/0090338 A1 | 3/2019 | Koh et al. |
| 2019/0096633 A1 | 3/2019 | Pankratz et al. |
| 2019/0157041 A1 | 5/2019 | Zyl et al. |
| 2019/0157042 A1 | 5/2019 | Van Zyl et al. |
| 2019/0157044 A1 | 5/2019 | Ziemba et al. |
| 2019/0172685 A1 | 6/2019 | Van Zyl et al. |
| 2019/0172688 A1 | 6/2019 | Ueda |
| 2019/0180982 A1 | 6/2019 | Brouk et al. |
| 2019/0198333 A1 | 6/2019 | Tokashiki |
| 2019/0259562 A1 | 8/2019 | Dorf et al. |
| 2019/0267218 A1 | 8/2019 | Wang et al. |
| 2019/0277804 A1 | 9/2019 | Prager et al. |
| 2019/0295769 A1 | 9/2019 | Prager et al. |
| 2019/0295819 A1 | 9/2019 | Okunishi et al. |
| 2019/0318918 A1 | 10/2019 | Saitoh et al. |
| 2019/0333741 A1 | 10/2019 | Nagami et al. |
| 2019/0341232 A1 | 11/2019 | Thokachichu et al. |
| 2019/0348258 A1 | 11/2019 | Koh et al. |
| 2019/0348263 A1 | 11/2019 | Okunishi |
| 2019/0363388 A1 | 11/2019 | Esswein et al. |
| 2019/0385822 A1 | 12/2019 | Marakhtanov et al. |
| 2019/0393791 A1 | 12/2019 | Ziemba et al. |
| 2020/0016109 A1 | 1/2020 | Feng et al. |
| 2020/0020510 A1 | 1/2020 | Shoeb et al. |
| 2020/0024330 A1 | 1/2020 | Chan-Hui et al. |
| 2020/0035457 A1 | 1/2020 | Ziemba et al. |
| 2020/0035458 A1 | 1/2020 | Ziemba et al. |
| 2020/0035459 A1 | 1/2020 | Ziemba et al. |
| 2020/0036367 A1 | 1/2020 | Slobodov et al. |
| 2020/0037468 A1 | 1/2020 | Ziemba et al. |
| 2020/0051785 A1 | 2/2020 | Miller et al. |
| 2020/0051786 A1 | 2/2020 | Ziemba et al. |
| 2020/0058475 A1 | 2/2020 | Engelstaedter et al. |
| 2020/0066497 A1 | 2/2020 | Engelstaedter et al. |
| 2020/0066498 A1 | 2/2020 | Engelstaedter et al. |
| 2020/0075293 A1 | 3/2020 | Ventzek et al. |
| 2020/0090905 A1 | 3/2020 | Brouk et al. |
| 2020/0106137 A1 | 4/2020 | Murphy et al. |
| 2020/0126760 A1 | 4/2020 | Ziemba et al. |
| 2020/0126837 A1 | 4/2020 | Kuno et al. |
| 2020/0144030 A1 | 5/2020 | Prager et al. |
| 2020/0161091 A1 | 5/2020 | Ziemba et al. |
| 2020/0161098 A1 | 5/2020 | Cui et al. |
| 2020/0161155 A1 | 5/2020 | Rogers et al. |
| 2020/0162061 A1 | 5/2020 | Prager et al. |
| 2020/0168436 A1 | 5/2020 | Ziemba et al. |
| 2020/0168437 A1 | 5/2020 | Ziemba et al. |
| 2020/0176221 A1 | 6/2020 | Prager et al. |
| 2020/0219706 A1 | 7/2020 | Koshimizu |
| 2020/0227230 A1 | 7/2020 | Ziemba et al. |
| 2020/0227289 A1 | 7/2020 | Song et al. |
| 2020/0234922 A1 | 7/2020 | Dorf et al. |
| 2020/0234923 A1 | 7/2020 | Dorf et al. |
| 2020/0243303 A1 | 7/2020 | Mishra et al. |
| 2020/0251371 A1 | 8/2020 | Kuno et al. |
| 2020/0266022 A1 | 8/2020 | Dorf et al. |
| 2020/0266035 A1 | 8/2020 | Nagaiwa |
| 2020/0294770 A1 | 9/2020 | Kubota |
| 2020/0328739 A1 | 10/2020 | Miller et al. |
| 2020/0352017 A1 | 11/2020 | Dorf et al. |
| 2020/0357607 A1 | 11/2020 | Ziemba et al. |
| 2020/0373114 A1 | 11/2020 | Prager et al. |
| 2020/0389126 A1 | 12/2020 | Prager et al. |
| 2020/0407840 A1 | 12/2020 | Hayashi et al. |
| 2020/0411286 A1 | 12/2020 | Koshimizu et al. |
| 2021/0005428 A1 | 1/2021 | Shaw et al. |
| 2021/0013006 A1 | 1/2021 | Nguyen et al. |
| 2021/0013011 A1 | 1/2021 | Prager et al. |
| 2021/0013874 A1 | 1/2021 | Miller et al. |
| 2021/0027990 A1 | 1/2021 | Ziemba et al. |
| 2021/0029815 A1 | 1/2021 | Bowman et al. |
| 2021/0043472 A1 | 2/2021 | Koshimizu et al. |
| 2021/0051792 A1 | 2/2021 | Dokan et al. |
| 2021/0066042 A1 | 3/2021 | Ziemba et al. |
| 2021/0082669 A1 | 3/2021 | Koshiishi et al. |
| 2021/0091759 A1 | 3/2021 | Prager et al. |
| 2021/0125812 A1 | 4/2021 | Ziemba et al. |
| 2021/0130955 A1 | 5/2021 | Nagaike et al. |
| 2021/0140044 A1 | 5/2021 | Nagaike et al. |
| 2021/0151295 A1 | 5/2021 | Ziemba et al. |
| 2021/0152163 A1 | 5/2021 | Miller et al. |
| 2021/0210313 A1 | 7/2021 | Ziemba et al. |
| 2021/0210315 A1 | 7/2021 | Ziemba et al. |
| 2021/0249227 A1 | 8/2021 | Bowman et al. |
| 2021/0272775 A1 | 9/2021 | Koshimizu |
| 2021/0288582 A1 | 9/2021 | Ziemba et al. |
| 2021/0398785 A1 | 12/2021 | Lin et al. |
| 2022/0037121 A1 | 2/2022 | Dorf et al. |
| 2022/0392750 A1 | 12/2022 | Yang et al. |
| 2022/0399183 A1 | 12/2022 | Cui et al. |
| 2022/0399186 A1 | 12/2022 | Cui et al. |
| 2022/0399189 A1 | 12/2022 | Guo et al. |
| 2022/0406567 A1 | 12/2022 | Yang et al. |
| 2022/0415614 A1 | 12/2022 | Yang et al. |
| 2023/0071168 A1 | 3/2023 | Ramaswamy et al. |
| 2023/0087307 A1 | 3/2023 | Guo et al. |
| 2023/0170192 A1 | 6/2023 | Guo et al. |
| 2023/0170194 A1 | 6/2023 | Guo et al. |
| 2023/0178337 A1 | 6/2023 | Kozakevich |

OTHER PUBLICATIONS

Lévêque, Philippe. "Electro-Optic Probe Devoted to Simultaneous Electric-Field and Temperature Measurements in Biological Media for Dosimetric Assessments." Radio Science Bulletin 342 (2012): 5. (Year: 2012).*

Li, Changsheng, and Toshihiko Yoshino. "Optical voltage sensor based on electrooptic crystal multiplier." Journal of lightwave technology 20.5 (2002): 815. (Year: 2002).*

Ko, K. "Flexibility and sensitivity enhancement in optical electric-field sensor with bulk electro-optic crystal." Japan: Tsukuba University (2010). (Year: 2010).*

Rhodes, Mark A., et al. "Performance of large-aperture optical switches for high-energy inertial-confinement fusion lasers." Applied Optics 34.24 (1995): 5312-5325. (Year: 1995).*

PCT/US2022/054313, International Search Report and Written Opinion dated Jun. 29, 2023, 8 pages.

Japanese Office Action issued to Patent Application No. 2023-503421 on Mar. 12, 2024.

* cited by examiner

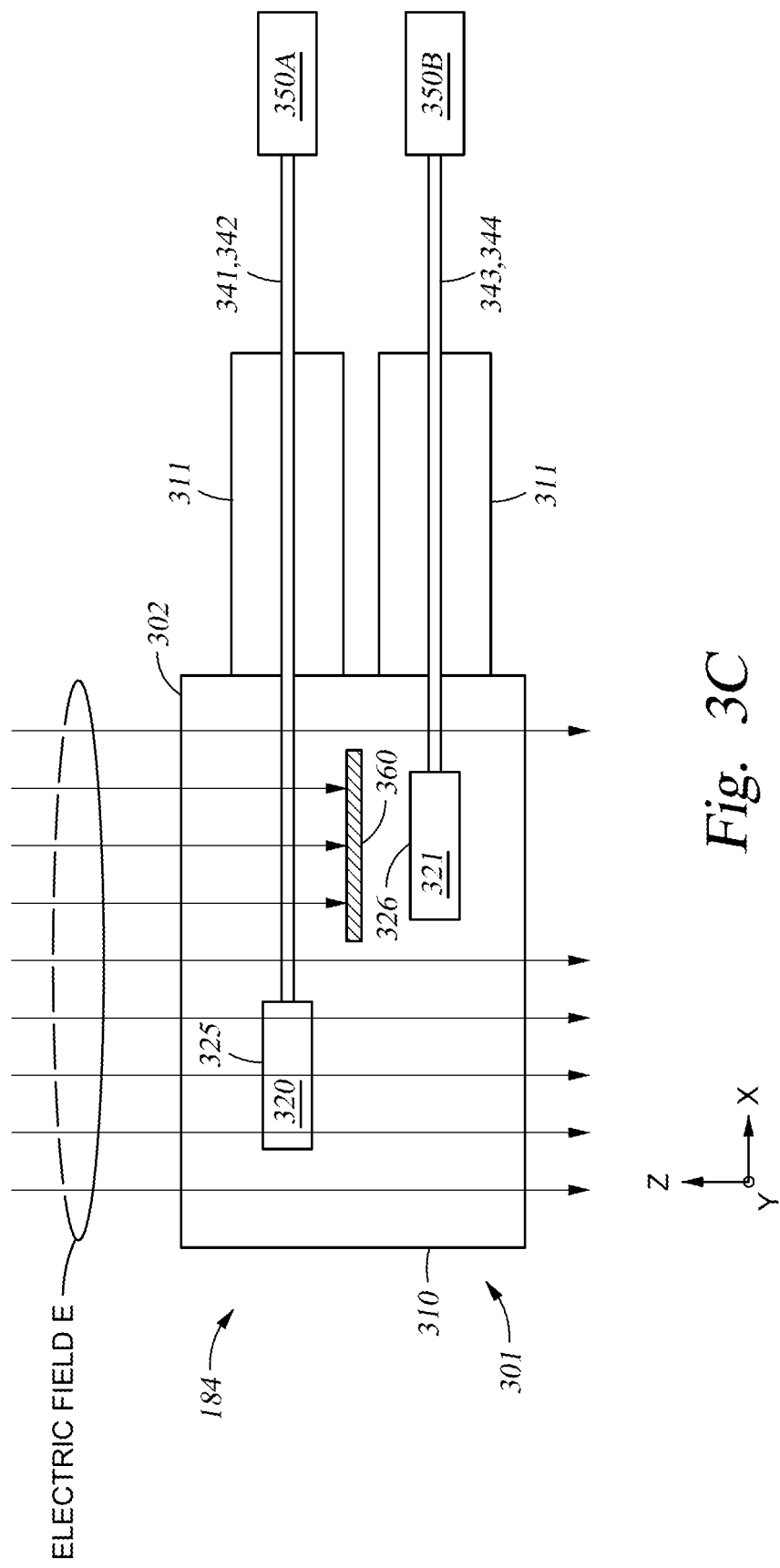

IN-SITU ELECTRIC FIELD DETECTION METHOD AND APPARATUS

BACKGROUND

Field

Embodiments of the present disclosure generally relate to a system and methods used in semiconductor device manufacturing. More specifically, embodiments provided herein generally include an apparatus and methods for measuring an electric field generated in a plasma processing chamber for diagnostic and control of a generated plasma formed in the plasma processing chamber purposes.

Description of the Related Art

Reliably producing high aspect ratio features is one of the key technology challenges for the next generation of semiconductor devices. One method of forming high aspect ratio features uses a plasma assisted etching process, such as a reactive ion etch (RIE) plasma process, to form high aspect ratio openings in a material layer, such as a dielectric layer, of a substrate. In a typical RIE plasma process, a plasma is formed in a processing chamber and ions from the plasma are accelerated towards a surface of a substrate to form openings in a material layer disposed beneath a mask layer formed on the surface of the substrate.

A typical Reactive Ion Etch (RIE) plasma processing chamber includes a radio frequency (RF) bias generator, which supplies an RF voltage to a power electrode, such as a metal plate positioned adjacent to an "electrostatic chuck" (ESC) assembly, more commonly referred to as the "cathode". The power electrode can be capacitively coupled to the plasma of a processing system through a thick layer of dielectric material (e.g., ceramic material), which is a part of the ESC assembly. In a capacitively coupled gas discharge, the plasma is created by using a radio frequency (RF) generator that is coupled to the power electrode, or a separate power electrode that is disposed outside of the ESC assembly and within the processing chamber, through an RF matching network ("RF match") that tunes the apparent load to 50Ω to minimize the reflected power and maximize the power delivery efficiency. The application of RF voltage to the power electrode causes an electron-repelling plasma sheath to form over a processing surface of a substrate that is positioned on a substrate supporting surface of the ESC assembly during processing. The non-linear, diode-like nature of the plasma sheath results in rectification of the applied RF field, such that a direct-current (DC) voltage drop, or "self-bias", appears between the substrate and the plasma, making the substrate potential negative with respect to the plasma potential. This voltage drop determines the average energy of the plasma ions accelerated towards the substrate, and thus etch anisotropically. More specifically, ion directionality, the feature profile, and etch selectivity to the mask and the stop-layer are controlled by the Ion Energy Distribution Function (IEDF). In plasmas with RF bias, the IEDF typically has two non-discrete peaks, one at a low energy and one at a high energy, and an ion population that has a range of energies that extend between the two peaks. The presence of the ion population in-between the two peaks of the IEDF is reflective of the fact that the voltage drop between the substrate and the plasma oscillates at the RF bias frequency. When a lower frequency RF bias generator is used to achieve higher self-bias voltages, the difference in energy between these two peaks can lead to process related issues, such as bowing of an etched feature walls formed on a surface of the substrate. Compared to the high-energy ions, the low-energy ions are less effective at reaching the corners at the bottom of the etched feature (e.g., due to the charging effect), but cause less sputtering of the mask material. This is important in high aspect ratio etch applications, such as hard-mask opening or dielectric mold etch. As feature sizes continue to diminish and the aspect ratio increases, while feature profile control requirements become more stringent, it becomes more desirable to have a well-controlled substrate bias and thus IEDF at the substrate surface during processing.

It has been found that conventional RF plasma-assisted etching processes, which only deliver sinusoidal waveform containing RF signals at conventional plasma generating biasing levels to one or more of the electrodes in a plasma processing chamber, do not adequately or desirably control the sheath properties and generated ion energies, which leads to undesirable plasma processing results. The undesirable processing results can include excessive sputtering of the mask layer and the generation of sidewall defects in high-aspect ratio features.

Moreover, substrate potential, or the self-bias created during plasma processing, is a critical parameter for assuring controllable and desirable plasma processing results. The determination of the substrate potential during plasma processing of a substrate can be used to improve the plasma processing results achieved on the substrate and subsequent substrates processed in the processing chamber. For example, the determination of the substrate potential in real time can be used to better control the actual bias voltage established at the substrate due to the capacitive coupling of a waveform applied to an adjacently positioned biasing electrode and compensate for any drift in the substrate potential due to changes in the processing environment. In other examples, the determination of the substrate potential can be used for plasma process diagnostics and optimization, and for electrostatic chucking and de-chucking control of the substrate during plasma processing. Conventionally, the potential of a substrate can only be inferred by use of an empirical model or experimentally measured by use of a wired non-production worthy dummy substrate or experimental probe using an offline non-production worthy diagnostic process testing method. Thus, using conventional processes, a direct real-time measurement substrate potential and real-time control of the substrate potential based on the measurement during the plasma processing of a semiconductor device containing production substrate is not possible.

Thus, there is a need in the art for plasma processing devices and biasing methods that are at least able to resolve the issues outlined above.

SUMMARY

Embodiments of the disclosure include an electric field measurement system. The electric field measurement system also includes a first light source configured to transmit electromagnetic energy at one or more wavelengths; a first light sensor configured to receive the electromagnetic energy transmitted at the one or more wavelengths. The system also includes at least one electro-optic sensor, that may include: a package may include a body; a first electro-optic crystal disposed within the body; and at least one optical fiber configured to transmit the electromagnetic energy transmitted from the first light source to a surface of the first electro-optic crystal; and transmit at least a portion of the electromagnetic energy that was transmitted to the surface of the first electro-optic crystal and subsequently passed through at least a portion of the first electro-optic crystal to the first light sensor, where the first light sensor is configured to generate a signal that varies based on an attribute of the portion of the electromagnetic energy received by the first light sensor from the at least one optical fiber. The system also includes a controller configured to receive the generated signal from the first light sensor and generate a command signal based on the received signal. Other embodiments of this aspect include corresponding computer systems, apparatus, and computer programs recorded on one or more computer storage devices, each configured to perform the actions of the methods.

Embodiments of the disclosure may further include a method of performing an electric field measurement using an electric field measurement system detecting, by use of a first electro-optic sensor, an electric field generated by a first component, where the first electro-optic sensor may include: a package may include a body; a first electro-optic crystal disposed within the body and positioned so that the generated electric field passes through at least a portion of the first electro-optic crystal; and at least one optical fiber. The method also includes transmitting, by use of a first light source, electromagnetic energy through the at least one optical fiber to a surface of the first electro-optic crystal while the electric field generated by a first component. The method also includes transmitting at least a portion of the electromagnetic energy, which was transmitted to the surface of the first electro-optic crystal and subsequently passed through at least a portion of the first electro-optic crystal, through the at least one optical fiber to a first light sensor. The method also includes generating, by the first light sensor, a first measurement signal that varies based on an attribute of the portion of the electromagnetic energy received by the first light sensor from the at least one optical fiber. The method also includes generating, by a controller, a command signal based on the generated first measurement signal, where the command signal is configured to provide information that is used to adjust a setting of a processing parameter of a plasma process performed in a plasma processing chamber. Other embodiments of this aspect include corresponding computer systems, apparatus, and computer programs recorded on one or more computer storage devices, each configured to perform the actions of the methods.

Embodiments of the disclosure include a method of performing an electric field measurement using an electric field measurement system. The method comprising detecting, by use of a first electro-optic sensor, an electric field generated by a first component, wherein the first electro-optic sensor comprises: a package comprising a body; a first electro-optic crystal disposed within the body and positioned so that the generated electric field passes through at least a portion of the first electro-optic crystal; and at least one optical fiber. The method also includes transmitting, by use of a first light source, electromagnetic energy through the at least one optical fiber to a surface of the first electro-optic crystal while the electric field generated by a first component; transmitting at least a portion of the electromagnetic energy, which was transmitted to the surface of the first electro-optic crystal and subsequently passed through at least a portion of the first electro-optic crystal, through the at least one optical fiber to a first light sensor; generating, by the first light sensor, a first measurement signal that varies based on an attribute of the portion of the electromagnetic energy received by the first light sensor from the at least one optical fiber; and generating, by a controller, a command signal based on the generated first measurement signal, wherein the command signal is configured to provide information that is used to adjust a setting of a processing parameter of a plasma process performed in a plasma processing chamber.

Embodiments of the disclosure include an electric field measurement system. The electric field measurement system may include a first light source configured to transmit electromagnetic energy at one or more wavelengths, a first light sensor configured to receive the electromagnetic energy transmitted at the one or more wavelengths, at least one electro-optic sensor, and a controller. The at least one electro-optic sensor may include a package comprising a body, a first electro-optic crystal disposed within the body; and at least one optical fiber. The optical fiber is configured to transmit the electromagnetic energy transmitted from the first light source to a surface of the first electro-optic crystal, and transmit at least a portion of the electromagnetic energy that was transmitted to the surface of the first electro-optic crystal and subsequently passed through at least a portion of the first electro-optic crystal to the first light sensor, wherein the first light sensor is configured to generate a signal that varies based on an attribute of the portion of the electromagnetic energy received by the first light sensor from the at least one optical fiber. The controller is configured to receive the generated signal from the first light sensor and generate a command signal based on the received signal.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

FIG. 3C is a side cross-sectional view of an alternate version of the sensing assembly illustrated in FIG. 3A, according to one embodiment, according to an embodiment.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure generally relate to a system used in semiconductor device manufacturing. More specifically, embodiments provided herein generally include apparatus and methods for measuring and controlling in real-time a potential formed on a substrate or plasma generating component disposed within a plasma processing chamber during processing. The measured potential can be used for plasma process monitoring, device calibration, process and device performance diagnostics, process chamber design optimization, and to improve the safety of a plasma processing chamber.

Figure 1:
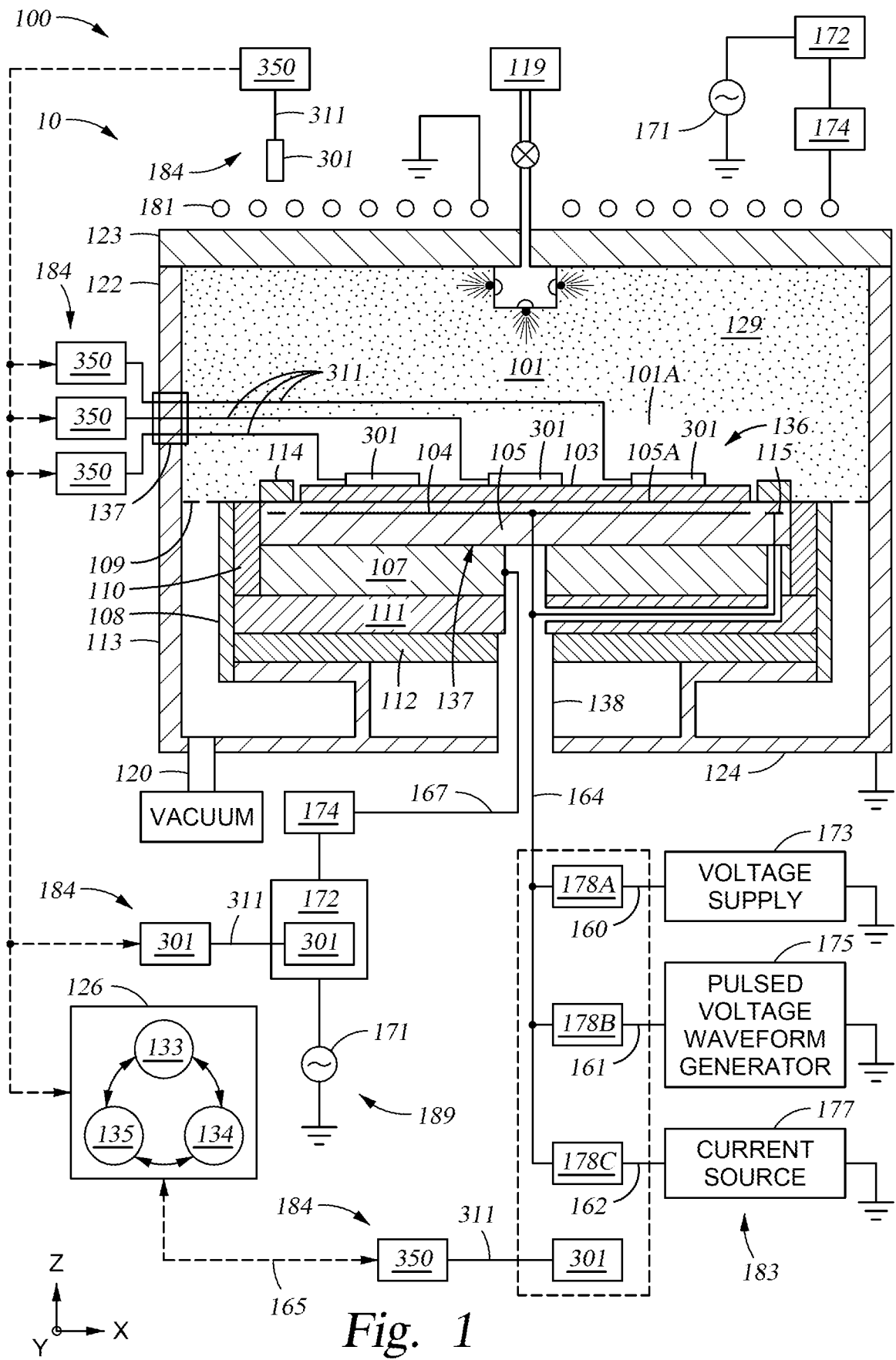
FIG. 1 is a schematic cross-sectional view of a processing system configured to practice the methods set forth herein, according to one or more embodiments.
Figure 2:
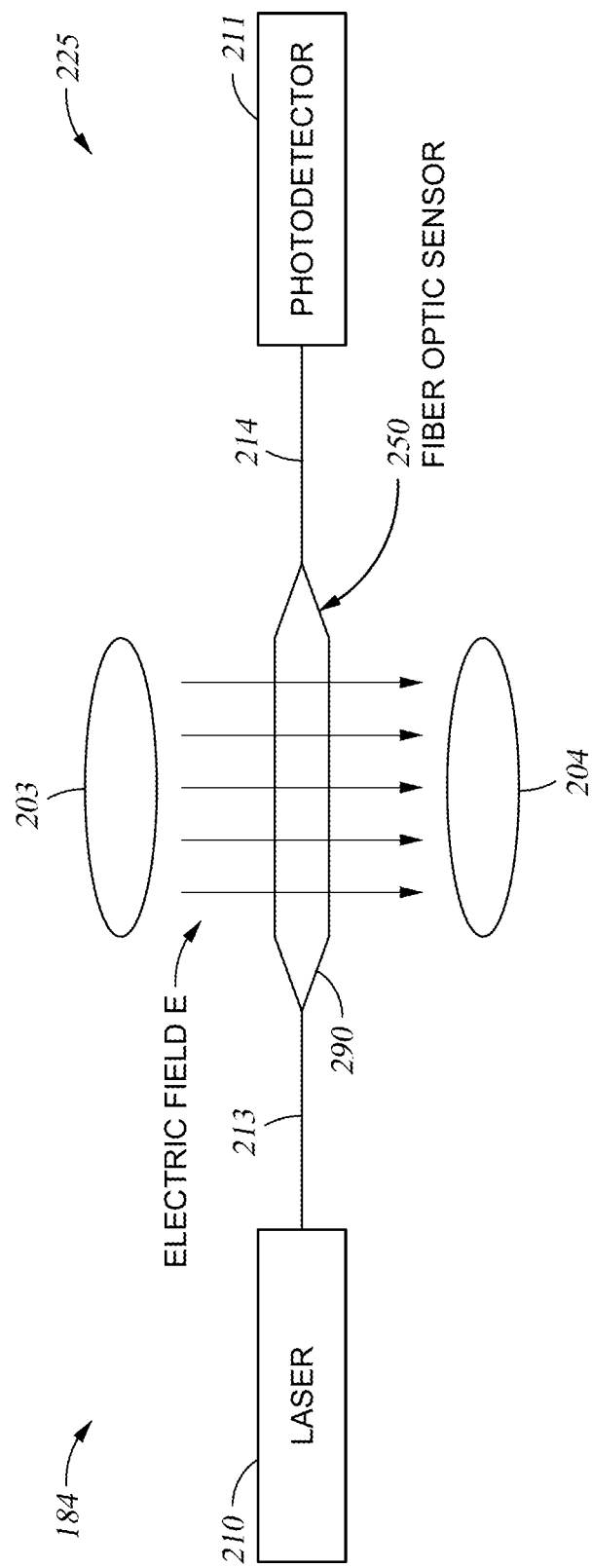
FIG. 2 is a schematic view of a portion of a signal detection assembly, according to one embodiment.

It has been found that electro-optic (EO) effect sensing devices that include EO sensing elements (e.g., EO crystal) provide a significant advantage over other conventional techniques used to detect generated potentials in one or more regions of a plasma processing chamber. Typical conventional measurement technics require circuit containing devices and conductive elements that typically alter and/or interfere with various electromagnetic fields generated in a plasma processing chamber during processing. The electromagnetic fields are typically generated due to the delivery of radio frequency (RF) and/or pulsed direct current (DC) voltage signals used to generate and control a plasma formed in a processing region of a processing chamber during operation. FIG. 1 is an example of a plasma processing system 10 and controller 126 that are configured to perform a plasma processing method. FIG. 2 is a simplified schematic of a signal detection assembly 225 that forms part of a sensing assembly 184 that can be positioned in a region of the plasma processing system 10 to sense the electric field strength E so that a generated voltage (V) within the region can then be determined (i.e., electric field E=−dV/ds, where "s" is the distance across which the field extends) and used to control one or more aspects of the plasma process. The signal detection assembly 225 includes a laser 210 and a photodetector 211 that are optically coupled to the one or more the fiber optic sensors 250 (e.g., a crystal) by use of one or more optical fibers. The one or more optical fibers can include a first optical fiber 213 and a second optical fiber 214. The laser 210 is coupled to the fiber optic sensor 250 via the first fiber optic cable 213. The fiber optic sensor 250 is coupled to the photodetector 211 via the second fiber optic cable 214. When the fiber optic sensor 250 is positioned between a first electrode 203 and a second electrode 204, the fiber optic sensor can be used to detect an electric field formed between the first electrode 203 and second electrode 204. The fiber optic sensor 250 includes an electro-optic (EO) effect sensing element, such as an electro-optic crystal 290, that is configured to detect a magnitude of the electric field E that passes there through, such as the electric field E created between the first electrode 203 and the second electrode 204 during plasma processing. In one embodiment, the electro-optic (EO) effect sensing element includes a crystal that uses Pockel's effect in which the birefringence of the crystal changes in proportion to the electric field applied to the optical crystal within the fiber optic sensor 250. In some embodiments, the electro-optic crystal 290 comprises a crystalline material, such as, for example, a crystal that includes lithium niobate ($LiNbO_3$), $LiTaO_3$, potassium dihydrogen phosphate (KDP) and its isomorphs, beta-barium borate (BBO), III-V semiconductors or other non-centrosymmetric media such as electric-field poled polymers or glasses. Any change in the electric field will result in a change in a characteristic of light received by the photodetector 211, due to the effect the change in the electric field has on an EO effect sensing element and the laser 210 generated light passing there through. In some embodiments, the laser 210 is configured to deliver a light at a wavelength between about 200 and 14000 nanometers (nm). Values associated with the change in the characteristic of the light received by the photodetector 211 can subsequently be relayed to the controller 126 to determine the electric potential or voltage formed between the electric field generating elements in the region of the plasma processing system 10 in which the fiber optic sensor 250 is positioned.

Figure 3A:
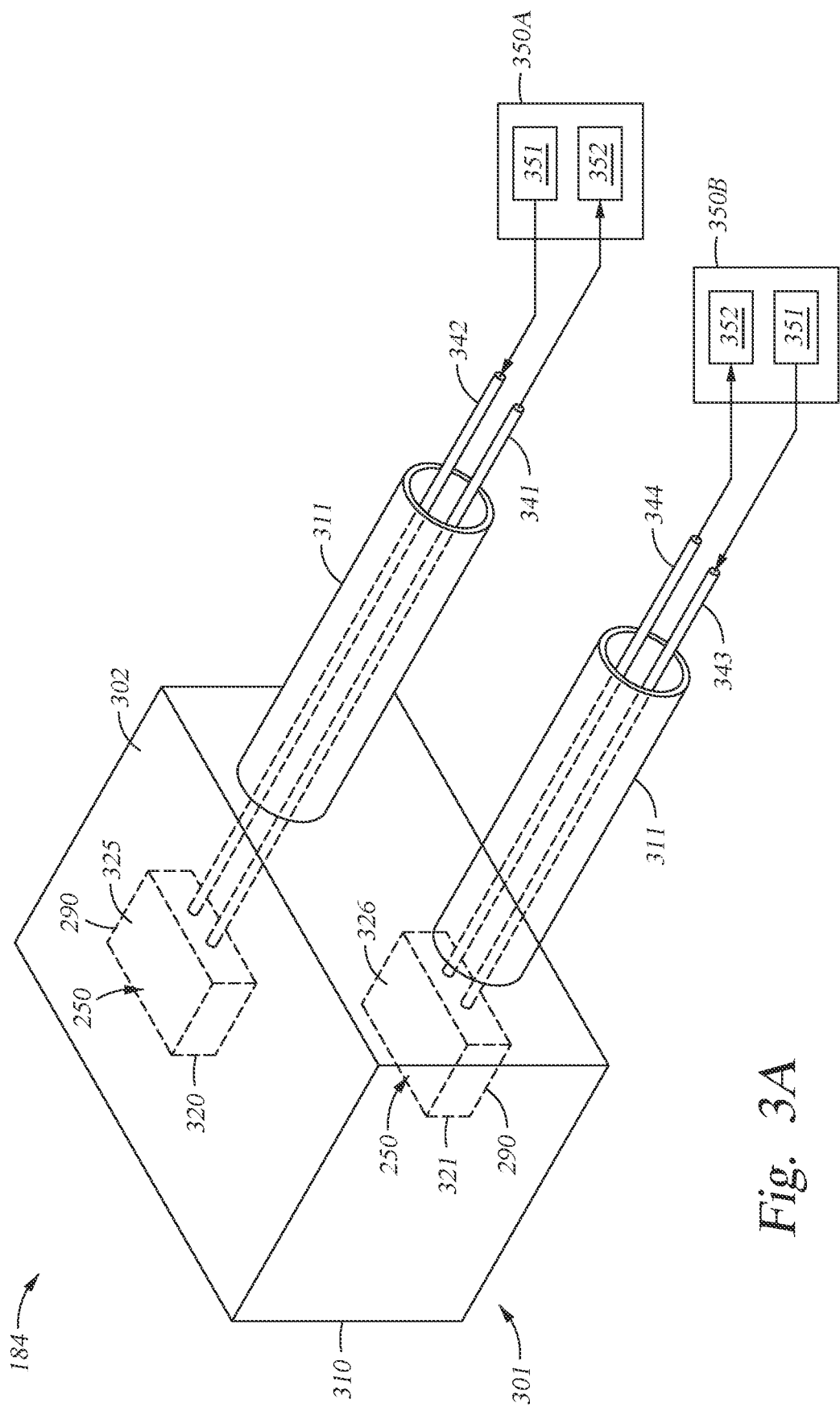
FIG. 3A is a top isometric view of a sensing assembly that includes a signal detection assembly, according to one or more embodiments.
Figure 3B:
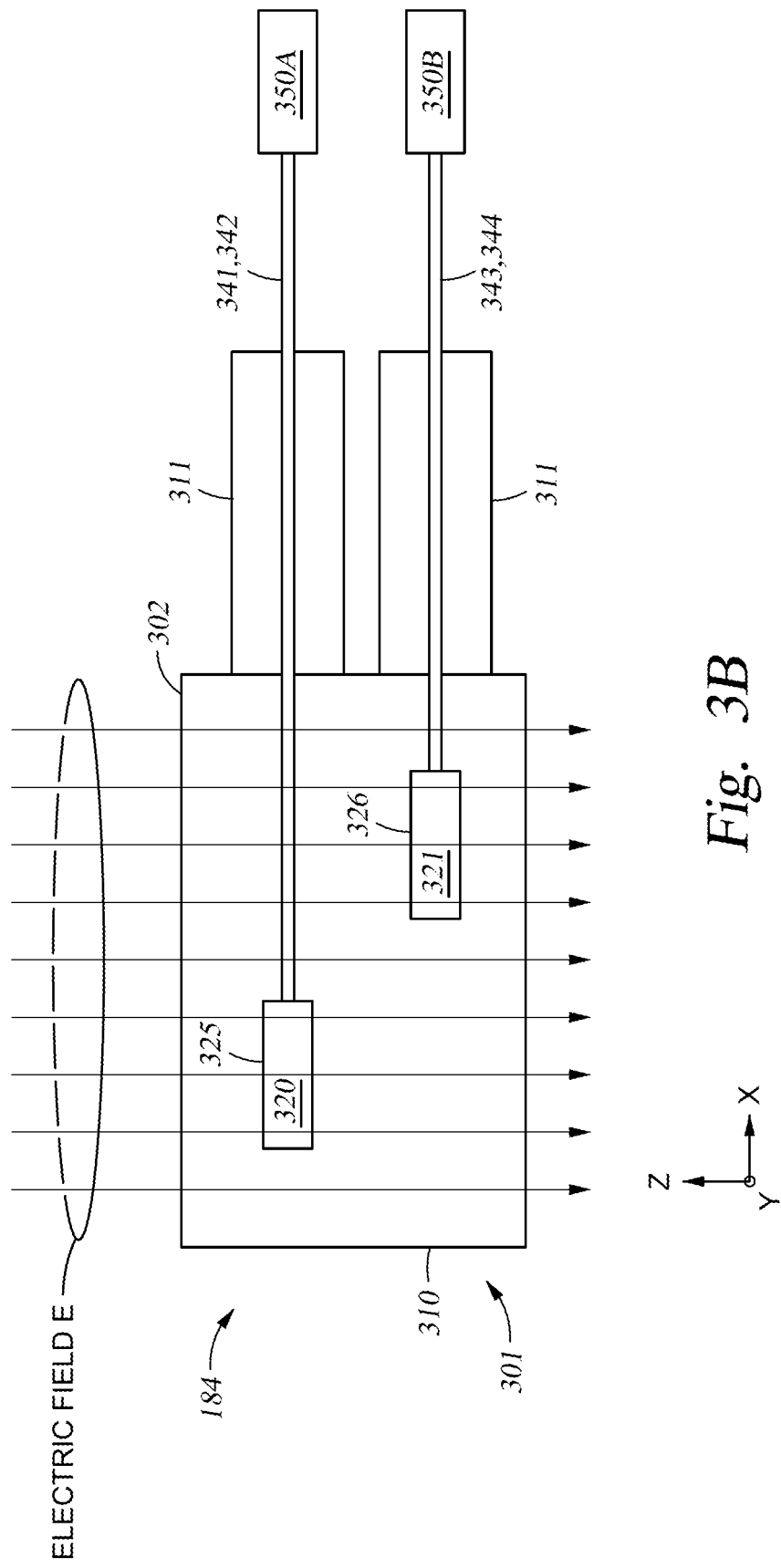
FIG. 3B is a side cross-sectional view of the sensing assembly illustrated in FIG. 3A, according to one embodiment.

However, it has been found that electric field strength measurements made by most EO effect sensor designs are temperature dependent and also dependent on the orientation of the sensing crystal to the orientation of the generated electric field lines. Therefore, embodiments of the disclosure provided herein, are configured compensate for these additional measurement variables. FIGS. 3A and 3B illustrate an embodiment of a sensing assembly 184 that includes a detector assembly 301 that includes a plurality of fiber optic sensors 250, such as a first fiber optic sensor 320 and a second fiber optic sensor 321 that are mounted within a package 310. The package 310 includes a body that may include a dielectric material that is able to support and retain each of the plurality of fiber optic sensors 250, and in some embodiments the body can include a ceramic material, polymeric material or other material that will not interfere with the operation of the fiber optic sensors and not significantly degrade when exposed to high temperatures, electric fields or the plasma processing environment. In one embodiment, the first fiber optic sensor 320 includes a pair of optical fibers 341 and 342 that each are in optical communication with a surface of an electro-optic crystal 290 at one end of the optical fibers and in optical communication with a first optical detection assembly 350A at the other end of the optical fibers. Similarly, the second fiber optic sensor 321 includes a pair of optical fibers 343 and 344 that each are in optical communication with a surface of an electro-optic crystal 290 at one end of the optical fibers and in optical communication with a second optical detection assembly 350B at the other end of the optical fibers. The optical fibers 341, 342 and 343, 344 are each disposed in a supporting sleeve 311 that extends between a surface of the body of the package 310 and the optical detection assembly 350A, 350B, and are used to protect the optical fibers from the external environment and from becoming damaged during installation and/or use. The sleeves 311 can be further protected by the use of ceramic beads, flexible metal tubes, or other useful materials that can provide chemical and thermal insulation and/or resistance to components they are exposed to during processing.

During operation an optical emission assembly 351 within an optical detection assembly 350 includes a laser 210 that is configured to deliver electromagnetic radiation (e.g., coherent light) to an input optical fiber 341, 343 that transmits the generated radiation to and through the electro-optic crystal 290, which, in some configurations, reflects and/or returns a significant portion of the generated radiation to the output optical fiber 342, 344 that then transmits the generated radiation to an optical detector 352 that is configured to detect aspects (e.g., intensity, polarization, etc.) of the received radiation and transmits information relating to the detected aspects of the received radiation to the controller 126. The optical detector 352 is configured to receive the electromagnetic radiation provided from the optical emission assembly 351 and then provide a signal that includes information relating to the detected aspects of the received electromagnetic radiation. The optical detector 352 can include an optoelectronic device such as a photoelectric effect type sensor (e.g., photodiode, photomultiplier tube), photoconductive type sensor, a photorefractive effect type sensor, or other useful device that is configured to convert electromagnetic energy into a signal that can be used by the controller 126. The controller 126 can then use the signal received from the optical detector 352 and generate a command signal to control some aspect of a process being performed in the processing chamber 100 or control the usage of a piece of hardware in the processing chamber 100. The controller 126 will generally analyze and use the information provided in the signal received from the optical detector 352 to monitor an aspect of the plasma process, help calibrate and/or improve the performance of one or more processing chamber components, optimize the processing chamber design, and to assure that the plasma processing chamber is safe, as will be discussed further below. The analysis performed by the controller 126 can include a comparison of the information provided in the signal and system configuration data that is stored in memory of the controller 126. The system configuration data can include benchmark data that was previously generated from prior process runs and/or user defined threshold values that are defined to assure portions of the processing chamber are functioning correctly.

As illustrated in FIGS. 3A and 3B, the first fiber optic sensor 320 and the second fiber optic sensor 321 are spaced a distance apart in a direction (e.g., X-direction) so that each of the electro-optic crystals 290 within each fiber optic sensor 250 is able to detect different portions of the electric field E that passes through the various components within the detector assembly 301 during processing. In general, it is desirable for the surfaces 325, 326 of the first fiber optic sensor 320 and the second fiber optic sensor 321, respectively, to be oriented at a desired orientation relative to the generated electric field E. In one example, the surfaces 325, 326 of the first fiber optic sensor 320 and the second fiber optic sensor 321, which may be aligned with features within the electro-optic crystals 290 (e.g., crystal planes), are oriented perpendicular to the predominant electric field E line direction (e.g., Z-direction). In some embodiments, it is desirable for a detector assembly 301 to include three or more fiber optic sensors 250. In one example, a package 310 includes a first fiber optic sensor 320, a second fiber optic sensor 321, and a third fiber optic sensor (not shown) that are oriented to separately measure an electric field E in three different orthogonal directions, such that each main surface (e.g., surface 325, 326) of each fiber optic sensor is oriented perpendicular to a different one of the X, Y and Z coordinate directions.

In an effort to compensate for temperature drift or variation in the measured electric field strength, and thus measured voltage, the measurement results provided in the signal received from the optical detector 352 by the controller 126 can be adjusted by use of fiber optic sensor calibration data that is stored in memory of the controller 126. In one embodiment, the effect of temperature on the measurement results from each of the fiber optic sensors 320, 321 can be stored in the form of a time variant formula or as data in a lookup table that was created based a known processing sequence. In one example, the variation in the optical properties of the electro-optic crystals 290 are collected and stored in memory for multiple standard plasma processing sequences performed in a first plasma processing chamber, and the stored data is used in subsequent plasma processing sequences to help adjust the measurements made in a similarly configured second plasma processing chamber that is running one of the multiple standard plasma processing sequences. In another embodiment, the effect of a temperature change on the measurement results can be determined by synchronizing the halting or cessation of the delivery of an electric field producing signal to an electrode, radio frequency (RF) coil or E-field generating element for a brief period of time to allow the fiber optic sensors 250 to collect at least one measurement without the electric field E being present so that a change in the optical properties of the electro-optic crystals 290 can be collected by comparing a measurement taken during the cessation of the electric field E versus a prior measurement taken when the electric field E also wasn't present. In one example, the optical properties of the electro-optic crystals 290 are measured at one or more intervals when the generated electric field E is stopped and compared with the optical properties of the electro-optic crystal 290 performed at some time prior to the beginning of the plasma process. In one process example, an optical detector 352 is adapted to in real time provide a measurement signal to the controller 126, wherein the measurement signal includes a first portion, in which an electric field is sensed by a fiber optic sensor 250, and a second portion, in which no electric field is sensed by the fiber optic sensor 250, thus allowing the effect of temperature to be determined by comparing the two portions of the measurement signal. In either of these cases, the temperature effect compensation factors determined from the use of the formula, data in the lookup table or by a comparison of measurements taken at different times can then be used to adjust the optical data collected by one or more of the fiber optic sensors to improve the accuracy of the derived voltage measurements.

FIG. 3C illustrates an embodiment of a sensing assembly 184 that includes a detector assembly 301 that includes at least one fiber optic sensors 250 that is configured to detect a variation in the electric field (i.e., first fiber optic sensor 320) and at least one fiber optic sensors 250 (i.e., second fiber optic sensor 321) that is similarly configured but is shielded from the electric field E by use of a shielding element 360. The shielding element 360 can include a conductive layer (e.g., metal layer) that is sized and positioned within the body of the package 310 so as to act as a Faraday shield for the shielded fiber optic sensors. In this configuration, due to the proximity of the two fiber optic sensors 250 and their thermal coupling to each other due to their position within the package 310, the measured optical properties of the electro-optic crystal 290 within the shielded fiber optic sensor, which is substantially unaffected by the presence of the electric field E passing through the body of the package 310, can be used as a baseline value to adjust the measurements made by the other fiber optic sensor that is exposed to the electric field E. In one example, the measured baseline value measured by the shielded second fiber optic sensor 321 can be subtracted from the measurements made by the first fiber optic sensor 320 to thus remove the effect that a change in temperature has on its measurement results.

Figure 3D:
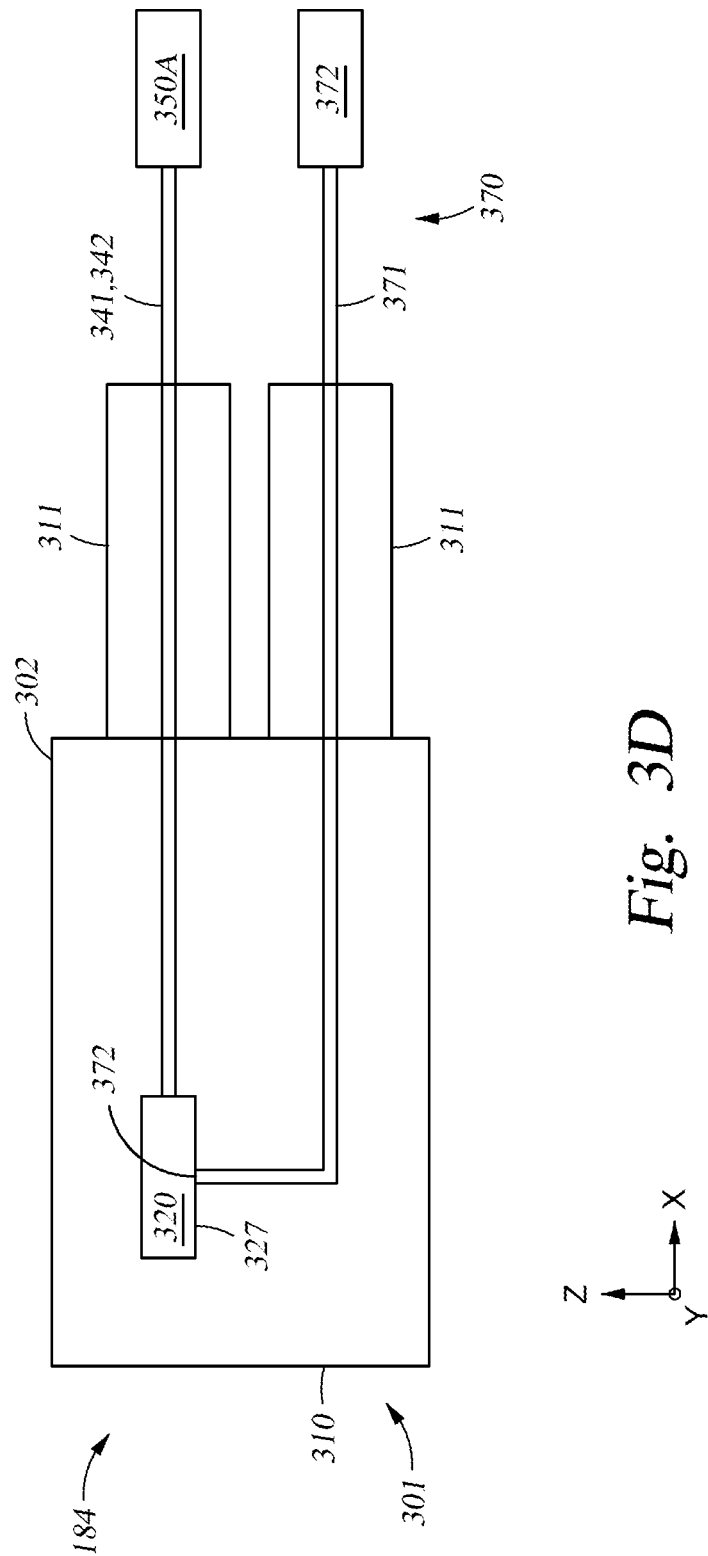
FIG. 3D is a side cross-sectional view of a sensing assembly, according to one embodiment.

FIG. 3D illustrates an embodiment of a sensing assembly 184 that includes a detector assembly 301 that includes at least one fiber optic sensors 250 that is configured to detect a variation in the electric field (i.e., first fiber optic sensor 320) and at least one optical temperature measurement assembly 370 that is configured to measure the temperature of the electro-optic crystal 290 while the fiber optic sensor 250 is taking electric field E measurements. The optical temperature measurement assembly 370 can include an optical fiber 371 that is positioned to collect radiation emitted from the electro-optic crystal 290 at one end and transfer the collected electromagnetic radiation to detector disposed within an optical detection assembly 372 positioned at an opposing end. In this case, the temperature measurement signal generated by the electronics in the optical detection assembly 372 due to the received radiation emitted from a surface 327 of the electro-optic crystal 290 can be delivered to the controller 126 so that the measurements collected by the fiber optic sensors 250 can be adjusted based on prior calibration data stored in memory to compensate for the variation in temperature of the electro-optic crystal 290. Conventional optical temperature measurement assemblies are available from Omega Engineering, Inc. of Norwalk, CT USA, or Advanced Energy Inc. of Fort Collins, CO USA that are configured to measure in a desired temperature range in which the electro-optic crystal 290 is exposed to during processing.

In some alternate embodiments, a temperature sensor that is external to the detector assembly 301, and not affected by the electric field E (e.g., optical temperature sensor probe), may be used. In this case a temperature signal generated by an external temperature sensor is sent to the controller 126 for processing and E field compensation.

Measurement Apparatus and Processing Methods

As discussed above, a sensing assembly 184, for example, includes a detector assembly 301 that includes a package 310 that includes one or more fiber optic sensors 250 and an optical detection assembly 350A that is optically coupled to a fiber optic sensor 250 via the optical fibers 341, 342. Referring back to FIG. 1, each sensing assembly 184 is communicatively coupled to the controller 126 via communication line 165. The controller 126 can then use the received output signal received from each of the optical detection assemblies to display a result or measurement performed by the fiber optic sensors 250 and/or control some part of the processing chamber 100 during processing. As explained in further detail below, the processing chamber 100 can include one or more sensing assemblies 184 that are positioned to detect an electric field, and thus the generated voltage in a region of the processing chamber 100, and provide feedback to the controller 126. Changes in a sensing parameter detected by a fiber optic sensor 250 are transmitted from the sensing assembly 184 to the controller 126. The controller 126 can then subsequently use the input received from the sensing assembly 184 to alter one or more plasma processing variables, such as altering a characteristic of an RF signal or pulsed voltage (PV) waveform generated by a PV waveform generator 175, and/or the amount of current provided from a current source 177 to the bias electrode 104 within the processing chamber 100.

FIG. 1 is a schematic cross-sectional view of the plasma processing system 10 which can be configured to perform one or more of the plasma processing methods. In some embodiments, the plasma processing system 10 is configured for plasma-assisted etching processes, such as a reactive ion etch (RIE) plasma processing. The plasma processing system 10 can also be used in other plasma-assisted processes, such as plasma-enhanced deposition processes (for example, plasma-enhanced chemical vapor deposition (PECVD) processes, plasma-enhanced physical vapor deposition (PEPVD) processes, plasma-enhanced atomic layer deposition (PEALD) processes, plasma treatment processing, plasma-based ion implant processing, or plasma doping (PLAD) processing. In one configuration, as shown in FIG. 1, the plasma processing system 10 is configured to form a capacitively coupled plasma (CCP). However, in some embodiments, a plasma may alternately be generated by an inductively coupled source disposed over the processing region of the plasma processing system 10. In this configuration, a RF coil may be placed on top of a ceramic lid (vacuum boundary) of the plasma processing system 10.

The plasma processing system 10 includes the processing chamber 100, a substrate support assembly 136, a gas system 182, a DC power system 183, an RF power system 189, one or more sensing assemblies 184, and a controller 126. The processing chamber 100 includes a chamber body 113 that comprises a chamber lid 123, one or more sidewalls 122, and a chamber base 124. The chamber lid 123, one or more sidewalls 122, and the chamber base 124 collectively define the processing volume 129. The one or more sidewalls 122 and chamber base 124 generally include materials (such as aluminum, aluminum alloys, or stainless steel alloys) that are sized and shaped to form the structural support for the elements of the processing chamber 100 and are configured to withstand the pressures and added energy applied to them while a plasma 101 is generated within a vacuum environment maintained in the processing volume 129 of the processing chamber 100 during processing. A substrate 103 is loaded into, and removed from, the processing volume 129 through an opening (not shown) in one of the sidewalls 122. The opening is sealed with a slit valve (not shown) during plasma processing of the substrate 103. A gas system 182, which is coupled to the processing volume 129 of the processing chamber 100, includes a processing gas source 119 and a gas inlet 128 disposed through the chamber lid 123. The gas inlet 128 is configured to deliver one or more processing gases to the processing volume 129 from the plurality of processing gas sources 119.

The processing chamber 100 further includes a chamber lid 123, RF coil 181 and a lower electrode (e.g., a substrate support assembly 136) disposed in a processing volume 129. The chamber lid 123 and lower electrode are positioned to face each other. As seen in FIG. 1, in one embodiment, a radio frequency (RF) source 171 is electrically coupled to the lower electrode. The RF source 171 is configured to deliver an RF signal to ignite and maintain a plasma (e.g., the plasma 101) between the upper and lower electrodes. In some alternative configurations, the RF source can also be electrically coupled to the upper electrode. For example, the RF source can be electrically coupled to the chamber lid. In another example, the RF source could also be electrically coupled to the substrate support base 107.

The substrate support assembly 136 includes a substrate support 105, a substrate support base 107, an insulator plate 111, a ground plate 112, a plurality of lift pins 186, and a bias electrode 104. Each of the lift pins 186 are disposed through a through hole 185 formed in the substrate support assembly 136 and are used to facilitate the transfer of a substrate 103 to and from a substrate support surface 105A of the substrate support 105. The substrate support 105 is formed of a dielectric material. The dielectric material can include a bulk sintered ceramic material, a corrosion-resistant metal oxide (for example, aluminum oxide ($Al_2O_3$), titanium oxide (TiO), yttrium oxide ($Y_2O_3$), a metal nitride material (for example, aluminum nitride (AlN), titanium nitride (TiN)), mixtures thereof, or combinations thereof.

The substrate support base 107 is formed of a conductive material (for example aluminum, an aluminum alloy, or a stainless steel alloy). The substrate support base 107 is electrically isolated from the chamber base 124 by the insulator plate 111, and the ground plate 112 interposed between the insulator plate 111 and the chamber base 124. In some embodiments, the substrate support base 107 is configured to regulate the temperature of both the substrate support 105, and the substrate 103 disposed on the substrate support 105 during substrate processing. In some embodiments, the substrate support 105 includes a heater (not shown) to heat the substrate support 105 and substrate 103 disposed on the substrate support 105.

A bias electrode 104 is embedded in the dielectric material of the substrate support 105. Typically, the bias electrode 104 is formed of one or more electrically conductive parts. The electrically conductive parts typically include meshes, foils, plates, or combinations thereof. Here, the bias electrode 104 functions as a chucking pole (i.e., electrostatic chucking electrode) that is used to secure (e.g., electrostatically chuck) the substrate 103 to the substrate support surface 105A of the substrate support 105. In general, a parallel plate like structure is formed by the bias electrode 104 and a layer of the dielectric material that is disposed between the bias electrode 104 and the substrate supporting surface 105A. The dielectric material can typically have an effective capacitance CE of between about 5 nF and about 50 nF. Typically, the layer of dielectric material (e.g., aluminum nitride (AlN), aluminum oxide ($Al_2O_3$), etc.) has a thickness between about 0.05 mm and about 5 mm, such as between about 0.1 mm and about 3 mm, such as between about 0.1 mm and about 1 mm, or even between about 0.1 mm and 0.5 mm. The bias electrode 104 is electrically coupled to a clamping network, which provides a chucking voltage thereto. The clamping network includes a DC voltage supply 173 (e.g., a high voltage DC supply) that is coupled to a filter 178A of the filter assembly 178 that is disposed between the DC voltage supply 173 and bias electrode 104. In one example, the filter 178A is a low-pass filter that is configured to block RF frequency and pulsed voltage (PV) waveform signals provided by other biasing components found within the processing chamber 100 from reaching the DC voltage supply 173 during plasma processing. In one configuration, the static DC voltage is between about −5000V and about 5000V, and is delivered using an electrical conductor (such as a coaxial power delivery line 160).

In some configurations, the substrate support assembly 136, further includes an edge control electrode 115. The edge control electrode 115 is formed of one or more electrically conductive parts. The electrically conductive parts typically include meshes, foils, plates, or combinations thereof. The edge control electrode 115 is positioned below the edge ring 114 and surrounds the bias electrode 104 and/or is disposed a distance from a center of the bias electrode 104. In general, for a processing chamber 100 that is configured to process circular substrates, the edge control electrode 115 is annular in shape, is made from a conductive material, and is configured to surround at least a portion of the bias electrode 104. As seen in FIG. 1, the edge control electrode 115 is positioned within a region of the substrate support 105, and is biased by use of a pulsed voltage (PV) waveform generator 175.

The DC power system 183 includes the DC voltage supply 173, the pulsed voltage (PV) waveform generator 175, and a current source 177. The RF power system 189 includes a radio frequency (RF) waveform generator 171, match 172, and a filter 174. As previously mentioned, the DC voltage supply 173 provides a constant chucking voltage, while the RF waveform generator 171 delivers an RF signal to the processing region, and the PV waveform generator 175 establishes a PV waveform at the bias electrode 104. Applying a sufficient amount of RF power to an electrode, such as the substrate support base 107, cause the plasma 101 to be formed in the processing region 129 of the processing chamber 100. In one configuration, the RF waveform has a frequency range between about 1 MHz and about 200 MHz.

In some embodiments, the power system 183 further includes a filter assembly 178 to electrically isolate one or more of the components contained within the power system 183. As shown in FIG. 1, a power delivery line 163 electrically connects the output of the RF waveform generator 171 to an impedance matching circuit 172, an RF filter 174 and substrate support base 107. Power delivery line 160 electrically connects the output of the voltage supply 173 to a filter assembly 178. Power delivery line 161 electrically connects the output of the PV waveform generator 175 to the filter assembly 178. Power delivery line 162 connects the output of the current source 177 to the filter assembly 178. In some embodiments, the current source 177 is selectively coupled to the bias electrode 104 by use of a switch (not shown) disposed in the delivery line 162, so as to allow the current source 177 to deliver a desired current to the bias electrode 104 during one or more stages (e.g., ion current stage) of the voltage waveform generated by the PV waveform generator 175. In one example, the voltage waveform provided from the PV waveform generator 175 can include a plurality of asymmetric voltage pulses that have a peak voltage range between ±5000 volts, a pulse on-time that is between 10% and 90% of the asymmetric voltage pulse period, and be delivered at a pulse repetition frequency that is between 100 kHz and 500 kHz. As seen in FIG. 1, the filter assembly 178, which can include multiple separate filtering components (i.e., discrete filters 178A-178C) that are each electrically coupled to the output node via power delivery line 164. The power delivery lines 160-164 include electrical conductors that include a combination of coaxial cables, such as a flexible coaxial cable that is connected in series with a rigid coaxial cable, an insulated high-voltage corona-resistant hookup wire, a bare wire, a metal rod, an electrical connector, of any combination of the above.

The controller 126, also referred to herein as a processing chamber controller, includes a central processing unit (CPU) 133, a memory 134, and support circuits 135. The controller 126 is used to control the process sequence used to process the substrate 103. The CPU is a general-purpose computer processor configured for use in an industrial setting for controlling the processing chamber and sub-processors related thereto. The memory 134 described herein, which is generally non-volatile memory, can include random access memory, read-only memory, hard disk drive, or other suitable forms of digital storage, local or remote. The support circuits 135 are conventionally coupled to the CPU 133 and comprises cache, clock circuits, input/output subsystems, power supplies, and the like, and combinations thereof. Software instructions (program) and data can be coded and stored within the memory 134 for instructing a processor within the CPU 133. A software program (or computer instructions) readable by CPU 133 in the controller 126 determines which tasks are performable by the components in the plasma processing system 10.

Typically, the program, which is readable by the CPU 133 in the controller 126 includes code, which, when executed by the CPU 133, performs tasks relating to the plasma processing schemes described herein. The program may include instructions that are used to control the various hardware and electrical components within the plasma processing system 10 to perform the various process tasks and various process sequences used to implement the methods described herein. In one embodiment, the program includes instructions that are used to perform one or more of the operations described below in relation to FIG. 4.

The controller 126 is in communication with the pulse voltage (PV) waveform generator 175 and the radio frequency (RF) waveform generator 171 so that one or more command signals provided from the controller 126 can be used to control aspects of the output signal (e.g., waveform characteristics) provided from the pulse voltage (PV) waveform generator or the radio frequency (RF) waveform generator during processing.

Processing Method Examples

Figure 4:
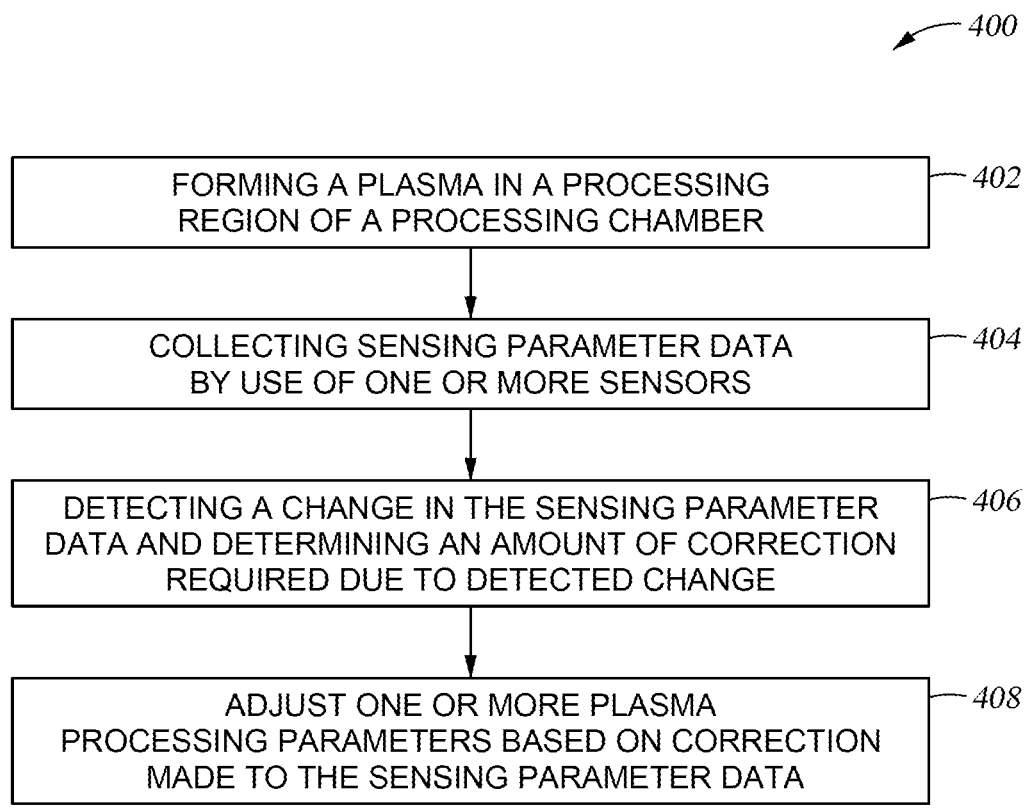
FIG. 4 is a diagram illustrating a method for real-time wafer potential measurement in a plasma processing system, according to one embodiment.

FIG. 4 is a diagram illustrating a method for real-time wafer potential measurement of a substrate or plasma generating component disposed within a plasma processing chamber. The method 400 includes generating a plasma in a processing region of a processing chamber, monitoring an electrical characteristic of a sensor disposed within a detector assembly 301 within a sensing assembly 184, forming a set of adjustment parameters based on the electrical characteristic, and adjusting one or more plasma processing parameters based on the monitored electrical characteristic of the sensor. Prior to performing method 400, one or more detector assemblies 301, and thus the one or more of the fiber optic sensors 250 disposed within the body of a package 310 of each detector assemblies 301, are positioned and aligned within one or more of the regions of the processing chamber 100 to detect a portion of an electric field formed therein.

At activity 402, the method 400 includes forming a plasma 101 in the processing chamber 100 at least partially due to the delivery of an RF signal, provided from the RF waveform generator 171 of the RF power system 189, to an electrode within the processing chamber 100. In some embodiments of activity 402, an asymmetric voltage waveform is also provided from the PV waveform generator 175 to an electrode (e.g., bias electrode 104) disposed within the processing chamber 100.

At activity 404, the method 900 includes measuring one or more sensing parameters based on a measurement collected by one or more sensors disposed within the processing chamber 100. The one or more sensing parameters can include one or more of an electric field strength measured by a fiber optic sensor 250, a change in optical properties of the electro-optic crystal 290, and in some cases can also include a temperature measurement provide by a temperature sensor. In some embodiments, the sensing parameter includes the real time measurement of the generated electric field E within a region of the processing chamber 100 by use of one or more of the one or more fiber optic sensors 250 within a sensing assembly 184. Activity 404 can include the measurement of an electric field E generated in a region of the RF coil 181 (FIG. 1) so as to detect an area of the RF coil 181 that includes an electric field E that is higher or lower than expected and thus may be prone to arcing or plasma non-uniformity. The measurements relating to the region of the RF coil 181 that is being measured are relayed to the controller 126 via the communication line 165 for analysis. Prior to the measurements made during activity 404, the detector assembly 301, and thus the one or more of the fiber optic sensors 250 disposed within the body of the package 310, are position and aligned so that a surface (e.g., surface 325, 326 shown in FIG. 3A) of the one or more fiber optic sensors 250 are aligned in an desired orientation to detect the electric field E generated by a region of the RF coil 181.

Additionally or alternately, during activity 404 a measurement of an electric field E generated in a region of the RF match 172 or filter assembly 178 is performed so as to detect an area of the RF match 172 or filter assembly 178 that includes an electric field E that is higher or lower than expected. The regions of that contain higher or lower electric fields may be prone to generating arcs or be signal that the electric field generating component is susceptible to premature failure. The measurements relating to the region of the RF match 172 and/or filter assembly 178 that are being measured during processing are relayed to the controller 126 via the communication line 165 for analysis. It is believed that the detection of electric fields generated by various electrical components within the RF match 172 and filter assembly 178, such as fixed or variable inductors, variable capacitors, and grounding elements (e.g., ground straps) that are out of a desired range can be useful to prevent any of these electrical components from causing variations in process results or damage to portions of the processing chamber 100.

Additionally or alternately, during activity 404 a measurement of an electric field E generated in the processing region 129 of the processing chamber 100 is performed by use of a moveable probe assembly (not shown) that is configured to be adjustably positioned within different areas of the processing region of the processing chamber 100 during plasma processing by use of an articulating arm (not shown) that is attached to a wall of the processing chamber 100. The moveable probe assembly can be used to map the electric field E generated in various regions of the processing chamber 100. The mapped electric fields can then be used to adjust the electrical power or properties of the electrical signals delivered to the plasma generating components, and/or even physically adjust the plasma generating components, to alter the plasma uniformity and/or prevent arcing or other undesirable attribute of the processing chamber design.

Additionally or alternately, during activity 404 a measurement of an electric field E generated at a surface of a substrate 103 is performed by use of an instrumented substrate. The instrumented substrate includes one or more detector assemblies 301 that are aligned, oriented and distributed in an array across a surface of the substrate so as to detect the amount of generated electric field E in each of the areas of the substrate surface to determine the amount of plasma non-uniformity and/or skew in the plasma density formed over different regions of the substrate surface. Referring to FIG. 1, in some embodiments, the supporting sleeves 311 and their associated optical fibers are connected to a vacuum compatible connector 137 that is configured to transfer the optical signals passing between portions of the optical fibers that are inside and outside of the processing chamber and between the fiber optic sensors 250 and the optical detection assemblies 350. The measurements relating to the electric fields E within the various regions of the substrate surface that are being measured are relayed to the controller 126 via the communication line 165 for analysis.

In some alternate configurations, measurement of an electric field E generated at a surface of a substrate 103 is performed by use of an array of fiber optic sensors 250 (not shown) that are aligned, oriented and embedded within the substrate support 105, such as in a region between the bias electrode 104 and the substrate supporting surface 105A. In this configuration, the supporting sleeves 311 and their associated optical fibers can be positioned to exit the bottom of the substrate support assembly 136 so that they can be connected to their associated optical detection assemblies 350 that are configured to deliver a signal to the controller 126.

At activity 406, the method 400 includes monitoring and analyzing a change in the sensing parameter detected by one or more fiber optic sensors 250 and other sensing elements (e.g., optical temperature measurement assembly 370) within one or more of the sensing assemblies 184. During activity 406, the controller 126 compares the data received from the one or more fiber optic sensors 250 and other sensing elements with information stored in memory of the controller 126 or other received sensor data to determine the desired amount of correction that is needed to compensate for a drift in temperature experienced by the one or more fiber optic sensors 250. The stored information may include equations or a look-up table that are configured to provide the amount of correction based on the data received by controller 126 that relates to the variation in temperature by use of one of the techniques described above. In one example, the sensing parameter is the change in electric field strength over time between points when no electric field E is present in the region of processing chamber 100. In another example, the sensing parameter is determined by a difference in the electric field E detected by a first fiber optic sensor 320 and a second fiber optic sensor 321 that is shielded from the electric field E by use of a shielding element 360. The controller 126 subsequently analyzes and uses the data received over time to determine an amount of adjustment that is required to electric field E measurement to correct for the variation in temperature.

At activity 408, the controller 126 then uses the determined amount of adjustment and resulting adjusted measurement data to generate a command signal that is used to adjust one or more plasma processing parameter based on the adjusted measurement. Plasma processing parameters can include any plasma processing variable that will affect a process result seen on substrate during or after plasma processing, and can include, but is not limited to, RF power level provided from an RF source, PV power level provided from an PV source, the act of halting the plasma process, gas flow rate, process chamber pressure, and substrate temperature. In one example, the controller 126 determines that an adjusted set of measurement data provided from a detector assembly 301 is higher than expected, due to a comparison of the adjusted measurement data and stored system configuration data, and then generates a command signal that is used to halt the processes being performed in the processing chamber due to a likelihood that arcing will occur in the processing chamber. In some embodiments of activity 408, the controller may also calculate an adjusted voltage measurement based the determined adjusted electric field E measurement and display information relating to the measurement on a graphical user interface (GUI) or store the result in memory for later use. In one example, the controller 126 determines that an adjusted set of measurement data provided from a detector assembly 301 within a region of the plasma processing chamber is higher or lower than expected, due to a comparison of the adjusted measurement data and stored system configuration data, and then generates a command signal that is used to provide information to a user that the electric field E in the region of the chamber is out of a desired range and thus one or more chamber components may need to adjusted, serviced or replaced.

Embodiments of the present disclosure described herein can be used to measure and control in real-time a potential formed on a substrate or plasma generating component disposed within a plasma processing chamber during processing. As noted herein, the measured potential can be used for plasma process monitoring, device calibration, process and device performance diagnostics, process chamber design optimization, and to improve the safety of a plasma processing chamber.

While the forgoing is directed to embodiments of the present disclosure, other and further embodiments of the disclosure may be devised without departing from the basic scope thereof, and the scope thereof is determined by the claims that follow.

What is claimed is:

1. An electric field measurement system, comprising:
 a first light source configured to transmit electromagnetic energy at one or more wavelengths;
 a first light sensor configured to receive the electromagnetic energy transmitted at the one or more wavelengths;
 an array of electro-optic sensors positioned on a surface of a substrate that is configured to be positioned on a substrate support in a processing chamber during a process performed in the processing chamber, the array of electro-optic sensors comprising:
  at least one electro-optic sensor, comprising:
   a package comprising a body;
   a first electro-optic crystal disposed within the body; and
   at least one optical fiber configured to:
    transmit the electromagnetic energy transmitted from the first light source to a surface of the first electro-optic crystal; and
    transmit at least a portion of the electromagnetic energy that was transmitted to the surface of the first electro-optic crystal and subsequently passed through at least a portion of the first electro-optic crystal to the first light sensor, wherein the first light sensor is configured to generate a signal that varies based on an attribute of the portion of the electromagnetic energy received by the first light sensor from the at least one optical fiber; and
 a controller configured to receive the generated signal from the first light sensor and generate a command signal based on the received signal.

2. The electric field measurement system of claim 1, further comprising:
 a second light source configured to transmit electromagnetic energy at one or more wavelengths; and
 a second light sensor configured to receive the electromagnetic energy transmitted at the one or more wavelengths,
 wherein the at least one electro-optic sensor, further comprises:
  a second electro-optic crystal disposed within the body; and
  at least one second optical fiber configured to:
   transmit the electromagnetic energy transmitted from the second light source to a surface of the second electro-optic crystal; and
   transmit at least a portion of the electromagnetic energy that was transmitted to the surface of the second electro-optic crystal and subsequently passed through at least a portion of the second electro-optic crystal to the second light sensor, wherein the second light sensor is configured to generate a signal that varies based on an attribute of the portion of the electromagnetic energy received by the second light sensor from the at least one optical fiber; and
 wherein the controller is further configured to receive the generated signal from the second light sensor and generate the command signal based on the signal received from the first light sensor and the second light sensor.

3. The electric field measurement system of claim 2, wherein the at least one electro-optic sensor, further comprises:
a shielding element positioned over the second electro-optic crystal and configured to shield the second electro-optic crystal from an electric field E passing through the body.

4. The electric field measurement system of claim 1, wherein the controller is configured to communicate with at least one of a pulse voltage (PV) waveform generator and a radio frequency (RF) waveform generator, and the command signal is configured to cause the pulse voltage (PV) waveform generator or the radio frequency (RF) waveform generator to adjust an output signal provided from the pulse voltage (PV) waveform generator or the radio frequency (RF) waveform generator.

5. The electric field measurement system of claim 1, wherein the controller having a processor configured to execute computer-readable instructions that cause the system to measure, by use of the at least one electro-optic sensor, a strength of an electric field over time within a region of the processing chamber.

6. The electric field measurement system of claim 1, wherein the controller has a processor configured to execute computer-readable instructions that cause the system to:
apply, by use of a radio frequency (RF) generator, a first RF waveform to a first electrode,
measure, by use of the at least one electro-optic sensor, a strength of an electric field over time within a region of the processing chamber; and
alter the first RF waveform generated by the RF generator based on the measured electric field strength.

7. An electric field measurement system, comprising:
a first light source configured to transmit electromagnetic energy at one or more wavelengths;
a first light sensor configured to receive the electromagnetic energy transmitted at the one or more wavelengths;
at least one electro-optic sensor, comprising:
a package comprising a body;
a first electro-optic crystal disposed within the body; and
at least one optical fiber configured to:
transmit the electromagnetic energy transmitted from the first light source to a surface of the first electro-optic crystal; and
transmit at least a portion of the electromagnetic energy that was transmitted to the surface of the first electro-optic crystal and subsequently passed through at least a portion of the first electro-optic crystal to the first light sensor,
wherein the first light sensor is configured to generate a signal that varies based on an attribute of the portion of the electromagnetic energy received by the first light sensor from the at least one optical fiber;
wherein the attribute is a strength of an electric field over time within a region of a processing chamber; and
a controller, wherein the controller has a processor configured to execute computer-readable instructions that cause the system to:
apply, by use of a pulsed voltage (PV) waveform generator, a first voltage waveform to a first electrode,
measure, by use of the at least one electro-optic sensor, the strength of an electric field over time within the region of the processing chamber; and
alter a pulse voltage (PV) waveform generated by the pulse voltage (PV) waveform generator based on the measured electric field strength.

8. An electric field measurement system, comprising:
a first light source configured to transmit electromagnetic energy at one or more wavelengths;
a first light sensor configured to receive the electromagnetic energy transmitted at the one or more wavelengths;
at least one electro-optic sensor, comprising:
a package comprising a body;
a first electro-optic crystal disposed within the body; and
at least one optical fiber configured to:
transmit the electromagnetic energy transmitted from the first light source to a surface of the first electro-optic crystal; and
transmit at least a portion of the electromagnetic energy that was transmitted to the surface of the first electro-optic crystal and subsequently passed through at least a portion of the first electro-optic crystal to the first light sensor,
wherein the first light sensor is configured to generate a signal that varies based on an attribute of the portion of the electromagnetic energy received by the first light sensor from the at least one optical fiber;
wherein the at least one electro-optic sensor is disposed within an RF match that has an input coupled to an output of an RF generator and an output adapted for coupling to an electrode disposed within a processing chamber, wherein the at least one electro-optic sensor is positioned to detect an electric field generated by one or more components within the RF match; and
a controller configured to receive the generated signal from the first light sensor and generate a command signal based on the received signal.

9. An electric field measurement system, comprising:
a first light source configured to transmit electromagnetic energy at one or more wavelengths;
a first light sensor configured to receive the electromagnetic energy transmitted at the one or more wavelengths;
at least one electro-optic sensor, comprising:
a package comprising a body;
a first electro-optic crystal disposed within the body; and
at least one optical fiber configured to:
transmit the electromagnetic energy transmitted from the first light source to a surface of the first electro-optic crystal; and
transmit at least a portion of the electromagnetic energy that was transmitted to the surface of the first electro-optic crystal and subsequently passed through at least a portion of the first electro-optic crystal to the first light sensor,
wherein the first light sensor is configured to generate a signal that varies based on an attribute of the portion of the electromagnetic energy received by the first light sensor from the at least one optical fiber;

wherein the at least one electro-optic sensor is positioned adjacent to a portion of a RF coil disposed within a processing chamber, wherein the at least one electro-optic sensor is positioned to detect an electric field generated by at least a portion of the RF coil during a process performed in the processing chamber; and a controller configured to receive the generated signal from the first light sensor and generate a command signal based on the received signal.

10. A method of performing an electric field measurement using an electric field measurement system, comprising:

detecting, by use of a first electro-optic sensor, an electric field generated by a first component, wherein the first electro-optic sensor comprises:
- a package comprising a body;
- a first electro-optic crystal disposed within the body and positioned so that the generated electric field passes through at least a portion of the first electro-optic crystal; and
- at least one optical fiber;

transmitting, by use of a first light source, electromagnetic energy through the at least one optical fiber to a surface of the first electro-optic crystal while the electric field generated by a first component;

transmitting at least a portion of the electromagnetic energy, which was transmitted to the surface of the first electro-optic crystal and subsequently passed through at least a portion of the first electro-optic crystal, through the at least one optical fiber to a first light sensor;

generating, by the first light sensor, a first measurement signal that varies based on an attribute of the portion of the electromagnetic energy received by the first light sensor from the at least one optical fiber; wherein generating the first measurement signal comprises:
- generating a first portion of the first measurement signal during a first period of time; and
- generating a second portion of the first measurement signal during a second period of time, wherein the electric field generated by the first component is generated during the first period of time and no electric field is generated by the first component during the second period of time; and generating, by a controller, a command signal based on the generated first measurement signal, wherein generating the command signal based on the generated first measurement signal further comprises:
- comparing the first portion of the measurement signal and the second portion of the measurement signal; and
- altering the command signal used to adjust a setting of a processing parameter based on the comparison, wherein the command signal is configured to provide information that is used to adjust a setting of a processing parameter of a process performed in a processing chamber, and wherein the processing parameter comprises altering a first voltage waveform generated by a pulse voltage (PV) waveform generator or an RF waveform generated by a radio frequency (RF) generator.

11. The method of claim 10, wherein the first component is selected from a group consisting of a component in an RF match, a component in a filter assembly, and a portion of RF coil.

12. The method of claim 10, further comprising:

detecting, by use of a second electro-optic sensor, an electric field generated by the first component;

transmitting, by use of a second light source, electromagnetic energy through at least one optical fiber to a surface of a second electro-optic crystal disposed within the body of the package while the electric field generated by a first component;

transmitting at least a portion of the electromagnetic energy, which was transmitted to the surface of the second electro-optic crystal and subsequently passed through at least a portion of the second electro-optic crystal, through the at least one optical fiber to a second light sensor; and generating, by the second light sensor, a second measurement signal that varies based on an attribute of the portion of the electromagnetic energy received by the second light sensor from the at least one optical fiber, wherein the generating the command signal by the controller further comprises:
- comparing the first measurement signal and the second measurement signal; and
- altering the information provided in the command signal used to adjust a setting of a processing parameter based on the comparison.

* * * * *